United States Patent
Segawa et al.

(10) Patent No.: US 9,478,525 B2
(45) Date of Patent: Oct. 25, 2016

(54) SEMICONDUCTOR DEVICE

(71) Applicant: PS4 Luxco S.a.r.l., Luxembourg (LU)

(72) Inventors: Machio Segawa, Tokyo (JP); Hisayuki Nagamine, Tokyo (JP)

(73) Assignee: PS4 LUXCO S.A.R.L., Luxembourg (LU)

( * ) Notice: Subject to any disclaimer, the term of this patent is extended or adjusted under 35 U.S.C. 154(b) by 0 days.

(21) Appl. No.: 14/900,050

(22) PCT Filed: Jun. 12, 2014

(86) PCT No.: PCT/JP2014/065613
§ 371 (c)(1),
(2) Date: Dec. 18, 2015

(87) PCT Pub. No.: WO2014/203803
PCT Pub. Date: Dec. 24, 2014

(65) Prior Publication Data
US 2016/0148907 A1 May 26, 2016

(30) Foreign Application Priority Data

Jun. 21, 2013 (JP) .................... 2013-130128

(51) Int. Cl.
*H01L 23/00* (2006.01)
*H01L 23/48* (2006.01)
(Continued)

(52) U.S. Cl.
CPC ......... *H01L 25/0657* (2013.01); *H01L 23/481* (2013.01); *H01L 23/522* (2013.01);
(Continued)

(58) Field of Classification Search
CPC ....... H01L 27/10; H01L 23/48; H01L 23/60; H01L 25/065; H01L 25/0657; H01L 27/092; H01L 24/17; H01L 23/00; H01L 23/481; H01L 23/528; H01L 2924/14; H01L 2924/13091; H01L 2924/16146; H01L 2225/06541; H01L 2225/065413; H01L 29/80
USPC ....... 257/369, 203, 686, 690, 202, 204, 207, 257/208, 210, 459, 529, 530
See application file for complete search history.

(56) References Cited

U.S. PATENT DOCUMENTS 8,456,020 B2 * 6/2013 Kurita .................. H01L 21/561
257/737
8,681,464 B2 * 3/2014 Nummila ................ H01L 23/62
361/111
(Continued)

FOREIGN PATENT DOCUMENTS

JP  2010087113  4/2010
JP  2012243953  12/2012

OTHER PUBLICATIONS

Application No. PCT/JP2014/065613, International Search Report, Sep. 2, 2014.

*Primary Examiner* — Chuong A Luu
(74) *Attorney, Agent, or Firm* — Kunzler Law Group, PC

(57) ABSTRACT

One semiconductor device includes nine surface micro-bumps laid out in a 3×3 matrix on a semiconductor substrate, a transistor that contains first and second diffusion layers formed on the semiconductor substrate, and power-supply wiring laid out on the semiconductor substrate. The aforementioned first diffusion layer is connected to one of the surface micro-bumps, the second diffusion layer is connected to the power-supply wiring, and the transistor is laid out in the region between the surface micro-bumps located on one edge in an X direction and the surface micro-bumps located on the other edge in said X direction.

9 Claims, 17 Drawing Sheets

(51) Int. Cl.
  *H01L 25/065*   (2006.01)
  *H01L 23/528*   (2006.01)
  *H01L 23/522*   (2006.01)
  *H01L 27/092*   (2006.01)
  *H01L 25/18*        (2006.01)
  *H01L 21/66*        (2006.01)
  *H01L 23/60*        (2006.01)
  *H01L 27/02*        (2006.01)

(52) U.S. Cl.
  CPC ........... *H01L23/5286* (2013.01); *H01L 24/17* (2013.01); *H01L 27/092* (2013.01); *H01L 22/32* (2013.01); *H01L 23/60* (2013.01); *H01L 24/05* (2013.01); *H01L 24/13* (2013.01); *H01L 24/16* (2013.01); *H01L 24/81* (2013.01); *H01L 25/18* (2013.01); *H01L 27/0248* (2013.01); *H01L 2224/0557* (2013.01); *H01L 2224/05568* (2013.01); *H01L 2224/13025* (2013.01); *H01L 2224/16145* (2013.01); *H01L 2224/16146* (2013.01); *H01L 2224/16148* (2013.01); *H01L 2224/16225* (2013.01); *H01L 2224/16238* (2013.01); *H01L 2224/17181* (2013.01); *H01L 2224/81193* (2013.01); *H01L 2225/06513* (2013.01); *H01L 2225/06517* (2013.01); *H01L 2225/06541* (2013.01); *H01L 2225/06555* (2013.01); *H01L 2225/06596* (2013.01); *H01L 2924/13091* (2013.01); *H01L 2924/14* (2013.01); *H01L 2924/15311* (2013.01)

(56) References Cited

U.S. PATENT DOCUMENTS

| | | |
|---|---|---|
| 2007/0145565 A1 | 6/2007 | Miyata et al. |
| 2010/0133678 A1 | 6/2010 | Saiki et al. |
| 2012/0134193 A1 | 5/2012 | Ide |
| 2012/0287541 A1 | 11/2012 | Matsui et al. |
| 2014/0014894 A1* | 1/2014 | Mohammed ............ H01L 33/62 257/13 |
| 2014/0043885 A1* | 2/2014 | Riho ........................ G11C 5/02 365/63 |

\* cited by examiner (a)

(b)

(a)  (b)

(a)

(b)

(c)

(a)

(b)

SEMICONDUCTOR DEVICE

TECHNICAL FIELD

The present invention relates to a semiconductor device and more particularly the present invention relates to a semiconductor device comprising a through-electrode placement region (or bump electrode placement region).

BACKGROUND

Electronic devices and the like have become more compact in recent years, and as a result there is also an increasing demand for greater compactness in semiconductor devices fitted in electronic devices and the like. Against this background, attention is focusing on technology in which multiple semiconductor chips are stacked in three dimensions rather than being arranged side-by-side in a plane. Among these technologies, a method of connecting chips using through-electrodes (through-substrate vias) running through a semiconductor chip is anticipated to be a technology which can reduce the mounting surface area of a semiconductor package because it does not require a region for routing bonding wires (see Patent Document 2, for example).

Furthermore, a semiconductor chip is generally provided with an electrostatic discharge protection circuit in order to prevent breakage of the internal circuitry caused by static electricity input through an external terminal. This kind of electrostatic discharge protection circuit is also provided in a semiconductor chip having the abovementioned through-electrodes, as described in Patent Document 1, for example. In this case, the electrostatic discharge protection circuit is disposed between the through-electrode placement region and the internal circuitry. Moreover, the through-electrode placement region is also a region for placement of bump electrodes which are provided together with or instead of the through-electrodes, so it can be said that the electrostatic discharge protection circuit is disposed between the bump electrode placement region and the internal circuitry.

Patent Documents

Patent Document 1: JP 2010-135192 A
Patent Document 2: JP 2012-243253 A

SUMMARY OF THE INVENTION

Problem to be Solved by the Invention

With the arrangement described in abovementioned Patent Document 1, however, the surface area is not utilized very efficiently because the electrostatic discharge protection circuit is present between the through-electrode placement region (or bump electrode placement region) and the internal circuitry so there are difficulties in terms of compactness. This is also a problem which is common to other circuits disposed between a through-electrode placement region (or bump electrode placement region) and internal circuitry, such as an output circuit for outputting read data, for example.

Means for Solving the Problem

A semiconductor device according to one aspect of the present invention comprises: a semiconductor substrate; first to third bump electrodes which are formed on the semiconductor substrate and are disposed at a first pitch along a first direction; fourth to sixth bump electrodes which are formed on the semiconductor substrate and are disposed at the first pitch along the first direction; seventh to ninth bump electrodes which are formed on the semiconductor substrate and are disposed at the first pitch along the first direction; a first transistor comprising first and second diffusion layers which are formed on the semiconductor substrate; and a power supply line disposed on the semiconductor substrate, the semiconductor device being characterized in that the first, fourth and seventh bump electrodes are disposed along a second direction intersecting the first direction at a second pitch such that the first bump electrode is located between the fourth and seventh bump electrodes, the second, fifth and eighth bump electrodes are disposed along the second direction at the second pitch such that the second bump electrode is located between the fifth and eighth bump electrodes, the third, sixth and ninth bump electrodes are disposed at the second pitch along the second direction such that the third bump electrode is located between the sixth and ninth bump electrodes, the first diffusion layer is connected to the first bump electrode, the second diffusion layer is connected to the power supply line, and the first transistor is disposed in a region between the fourth and sixth bump electrodes and the seventh and ninth bump electrodes.

Advantage of the Invention

According to the present invention, a first transistor is disposed in a region between fourth and sixth bump electrodes and seventh and ninth bump electrodes. That is to say, the first transistor is disposed within a bump electrode placement region, so there is no need for a region for placing the first transistor to be provided outside the bump electrode placement region. This makes it possible to utilize the surface area more efficiently and to achieve a more compact semiconductor device.

BRIEF DESCRIPTION OF THE FIGURES

FIG. 19 (a) is a schematic view in cross section to illustrate the structure of a semifinished article 10aA of a semiconductor device 10a according to a variant example of a preferred mode of embodiment of the present invention, and (b) is a schematic view in cross section to illustrate the structure of the semiconductor device 10a.

MODE FOR IMPLEMENTING THE INVENTION

Figure 1:
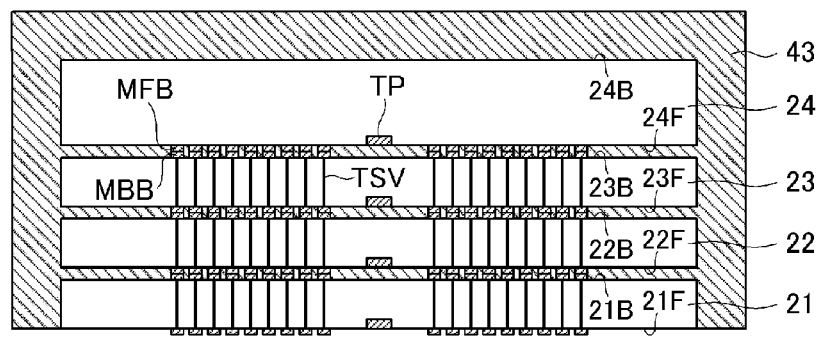
FIG. 1 (a) is a schematic view in cross section to illustrate the structure of a semifinished article 10A of a semiconductor device 10 according to a preferred first mode of embodiment of the present invention, and (b) is a schematic view in cross section to illustrate the structure of the semiconductor device 10.
Figure 1:
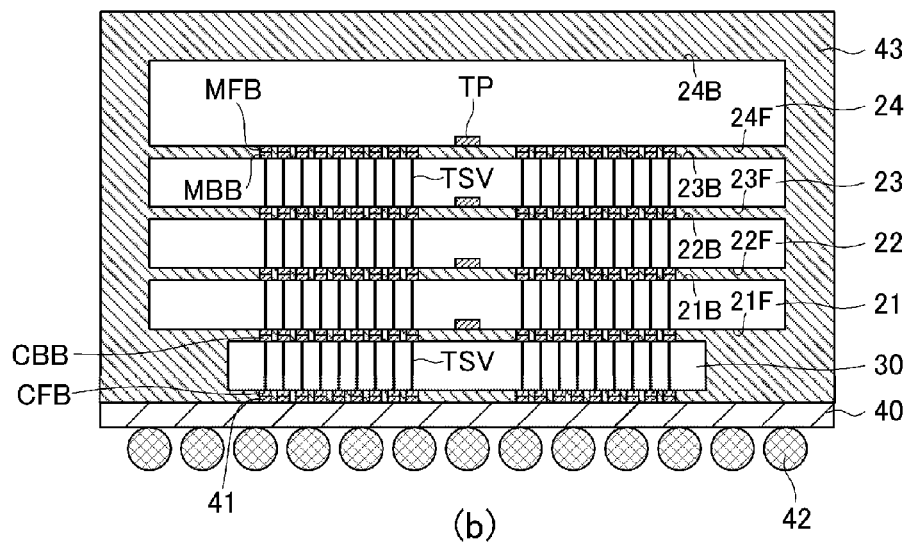

Preferred modes of embodiment of the present invention will be described in detail below with reference to the appended drawings.

As shown in FIG. 1(b), a semiconductor device 10 according to a first mode of embodiment of the present invention has a configuration in which one control chip 30 and four memory chips 21-24 are stacked. The memory chips 21-24 are all what are known as "wide-IO dynamic random access memories" (DRAMs), and comprise main surfaces 21F-24F and back surfaces 21B-24B, respectively. It should be noted that the main surfaces 21F-24F constitute the surfaces on the side on which various types of circuit elements such as transistors (not depicted) are formed. The memory chips 21-24 are stacked on the control chip 30 in a state in which the main surfaces 21F-24F are facing the control chip 30, i.e. in a facedown form.

The memory chips 21-23 have the same configuration. The description will focus on the memory chip 21; a plurality of front-surface micro-bumps MFB (bump electrodes) and a plurality of test pads TP are provided on the main face 21F of the memory chip 21. Furthermore, a plurality of back-surface micro-bumps MBB are provided on the back surface 21B of the memory chip 21. A more detailed description will be given later, but the front-surface micro-bumps MFB and the back-surface micro-bumps MBB are connected to one another by means of through-electrodes TSV which pass through a semiconductor substrate (not explicitly depicted in FIG. 1(b)) included in the memory chip 21.

The back-surface micro-bumps MBB are joined to the front-surface micro-bumps MFB of another adjacent memory chip on the back-surface side, and an electrical connection between adjacent memory chips is ensured as a result. The front-surface micro-bumps MFB of the memory chip 21 located in the bottommost layer are joined to back-surface micro-bumps CBB (to be described later) of the control chip 30. Various signals are sent and received between the control chip 30 and the memory chips 21-24 via these junctions.

The memory chip 24 located in the topmost layer differs from the memory chips 21-23 in that it does not comprise back-surface micro-bumps MBB or through-electrodes TSV, but otherwise has the same configuration as the memory chips 21-23. The difference will be described in detail below.

As described above, the memory chips 21-24 are stacked on the control chip 30 in a facedown form. The through-electrodes TSV and the back-surface micro-bumps MBB are therefore used solely for relaying signals applied to memory chips in layers above, and there is no need to provide the through-electrodes TSV and the back-surface micro-bumps MBB on the memory chip 24 located in the topmost layer. Meanwhile, it is possible to reduce the thickness of the memory chip 24 in comparison with the other memory chips 21-23 by not providing the through-electrodes TSV. If the memory chip 24 is thicker, it is possible to curb chip deformation caused by thermal stress (thermal stress mainly generated during stacking of the memory chips 21-24) when the semiconductor device 10 is manufactured, so although there is a difference in the chip manufacturing processes for the memory chips 21-23 and the memory chip 24 in the semiconductor device 10 according to this mode of embodiment, the back-surface micro-bumps MBB and the through-electrodes TSV are not provided in the memory chip 24, as mentioned above. However, it is also possible to employ, as the memory chip 24, a chip having the through-electrodes TSV and back-surface micro-bumps MBB in the same way as the memory chips 21-23.

The control chip 30 is a semiconductor chip (SOC) for controlling operations of the memory chips 21-24, and is mounted in a facedown form on a circuit board 40. That is to say, the control chip 30 is mounted on the circuit board 40 in such a way that a main surface 30F which is the surface on the side on which various circuit elements are formed faces the circuit board 40 side and a back surface 30B faces the memory chip 21-24 side.

A plurality of front-surface micro-bumps CFB are formed on the main surface 30F of the control chip 30 and a plurality of back-surface micro-bumps CBB are formed on the back surface 30B of the control chip 30. The front-surface micro-bumps CFB are joined to board electrodes 41 provided on the circuit board 40. Meanwhile, the back-surface micro-bumps CBB are joined to the front-surface micro-bumps MFB provided on the bottommost memory chip 21, as indicated above. Internal circuits provided in the memory chip 30 are connected to the front-surface micro-bumps CFB through wiring which is not depicted, and are also connected to the back-surface micro-bumps CBB by way of through-electrodes TSV provided running through the control chip 30.

The circuit board 40 has a structure in which the board electrodes 41 are provided on an upper surface while external terminals 42 are provided on a lower surface. The control chip 30 is mounted on the upper surface of the circuit board 40, as indicated above. The board electrodes 41 and the external terminals 42 are connected to one another by way of through-hole conductors (not depicted) running through the circuit board 40. Furthermore, a sealing resin 43 that covers the memory chips 21-24 and the control chip 30 is provided on the upper surface of the board electrodes 41.

The external terminals 42 are used when the control chip 30 inputs/outputs various signals (address signals, command signals, clock signals, data and the like) with another device or the like which is not depicted. Specifically, when mounted on a motherboard, the semiconductor device 10 is connected to various types of analog chip such as a sensor or a nonvolatile memory, and to various types of input/output interfaces. The control chip 30 stores, in the memory chips 21-24, data signals which it has generated itself in accordance with various signals from the other devices, by way of the back-surface micro-bumps CBB and the front-surface micro-bumps MFB etc. Furthermore, the control chip 30 generates signals which are supplied to the other devices etc., in accordance with data supplied from the memory chips 21-24 by way of the back-surface micro-bumps CBB and the front-surface micro-bumps MFB etc.

In the process of manufacturing the semiconductor device 10, a semifinished article 10A shown in FIG. 1(a) is preferably prepared, and this is preferably connected to the control chip 30 and to the circuit board 40. As shown in FIG. 1(a), the semifinished article 10A comprises the memory chips 21-24 and the sealing resin 43 that covers the surfaces thereof, excluding the main surface 21F of the memory chip 21. However, it is not essential to use the semifinished article 10A, and it is equally possible, for example, to mount the control chip 30 and the memory chips 21-24 on the circuit board 40 and then to seal the chips 21-24 and 30 by means of the sealing resin 43. When the semifinished article 10A is used, the control chip 30 to which it is to be connected may be varied according to the specification or application, so this allows greater versatility.

Figure 2:
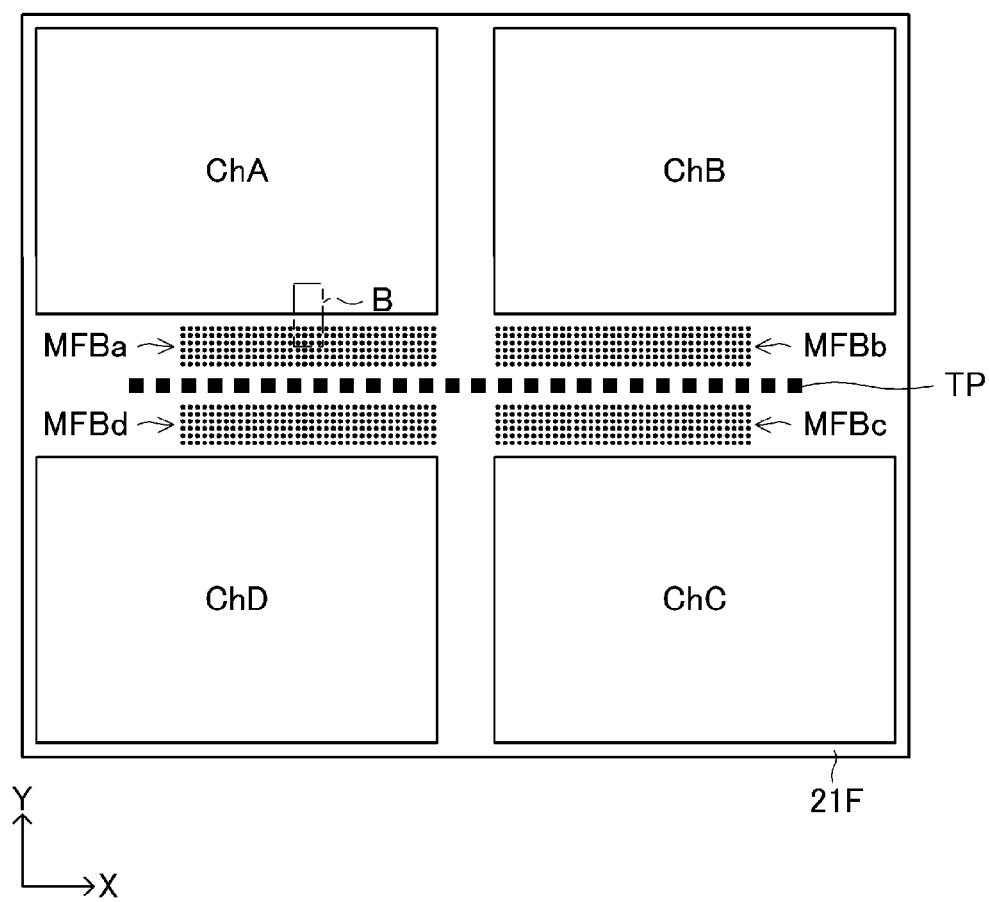
FIG. 2 is a plan view of a main surface 21F of a memory chip 21 shown in FIG. 1(a)

As illustrated in FIG. 2, four channels ChA-ChD disposed in the form of a matrix in the X-direction and the Y-direction are provided on the main surfaces 21F-24F of the memory chips 21-24. The channels ChA-ChD are circuit blocks that can operate as individual DRAMs, and therefore the memory chips 21-24 have a configuration in which four independent DRAMs are rendered as a single chip.

As indicated above, a plurality of the front-surface micro-bumps MFB are provided on the main surfaces 21F-24F. The front-surface micro-bumps MFB correspond to the respective channels ChA-ChD, and in FIG. 2 the front-surface micro-bumps MFB corresponding to the channels ChA-ChD are denoted by the respective front-surface micro-bumps MFBa-MFBd. There are a very large number, e.g. 128, of front-surface micro-bumps MFB used for data allocated to the channels ChA-ChD, and a large number of front-surface micro-bumps MFB for power supply etc. are also required for each channel, so around 300 front-surface micro-bumps MFB are provided for each channel ChA-ChD, for example. More than 1000 front-surface micro-bumps MFB are therefore used in the chip as a whole.

Test terminals which are known as direct access terminals are also included among the front-surface micro-bumps MFB. However, the front-surface micro-bumps MFB are extremely small in size so it is difficult to make tester probes come into contact with the direct access terminals. For this reason, test pads TP allowing tester probes to make contact are allocated to each direct access terminal. The test pads TP have a larger planar size than the front-surface micro-bumps MFB and allow the tester probes to make contact as a result. When the memory chips 21-24 are subjected to a working test at the stage in FIG. 1(a) (before stacking) or the stage in a wafer state, various types of signals are sent/received between the tester and the memory chips 21-24 through the test pads TP. On the other hand, when the memory chips 21-24 are subjected to a working test at the stage in FIG. 1(b) (after stacking), various types of signals are sent/received between the tester and the memory chips 21-24 via the control chip 30.

The through-electrodes TSV formed in the memory chips 21-23 may be categorized into a number of types depending on the mode of connection with the internal circuits and the through-electrodes TSV of another adjacent memory chip. The through-electrodes TSV1, TSV2 shown in FIGS. 3(a) and (b) are one example of a type of through-electrode TSV.

Figure 3:
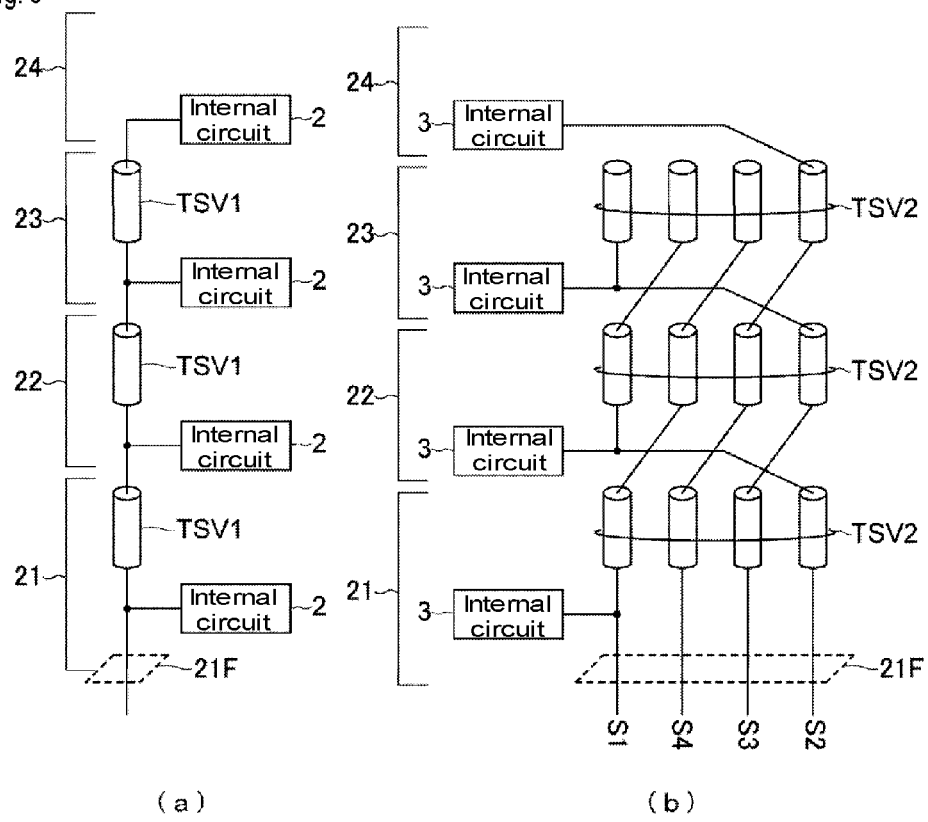
FIGS. 3 (a) and (b) are schematic diagrams to illustrate the state of connection of through-electrodes TSV1 and TSV2.

The through-electrodes TSV1 shown in FIG. 3(a) are short-circuited with through-electrodes TSV1 in another layer provided in the same planar position in a plan view seen from the stacking direction, i.e. when seen from the arrow A shown in FIG. 1. That is to say, as shown in FIG. 3(a), the through-electrodes TSV1 provided in the same vertical position in plan view are short-circuited and one signal path is formed by these through-electrodes TSV1. The signal path is connected to respective internal circuits 2 of the memory chips 21-24. Input signals (command signals, address signals, clock signals, write data and the like) supplied to the signal path from the control chip 30 are therefore input in common to the internal circuits 2 of the memory chips 21-24. Furthermore, output signals (read data and the like) supplied to the signal path from the internal circuits 2 of the memory chips 21-24 are subjected to wired-OR and output to the control chip 30.

Meanwhile, the through-electrodes TSV2 shown in FIG. 3(b) are short-circuited with the through-electrodes TSV2 of other memory chips provided in different positions in plan view. To describe this in specific terms, four through-electrodes TSV2 are provided in the same position in plan view in the memory chips 21-23, and the $N^{th}$ (N=1-3) through-electrode TSV2 provided in a lower-layer memory chip is connected to the $N+1^{th}$ through-electrode TSV2 provided in an upper-layer memory chip. The fourth through-electrode TSV2 provided in the lower-layer memory chip (the through-electrode TSV2 furthest to the right in FIG. 3(b)) is connected to the first through-electrode TSV2 provided in the upper-layer memory chip (the through-electrode TSV2 furthest to the left in FIG. 3(b)). Four independent signal paths are formed by this kind of cyclic connection.

Out of the four through-electrodes TSV2, a through-electrode TSV2 provided in a predetermined position (the through-electrode TSV2 furthest to the left in FIG. 3(b)) is connected to an internal circuit 3 inside the memory chips 21-23. Furthermore, the internal circuit 3 included in the memory chip 24 of the topmost layer is connected to the through-electrode TSV2 furthest to the right included in the memory chip 23.

By virtue of this configuration, signals S1-S4 shown in FIG. 3(b) are selectively input to the internal circuits 3 of the respective memory chips 21-24. Examples of these signals which may be cited include a chip select signal CS and a clock enable signal CLK.

Figure 4:
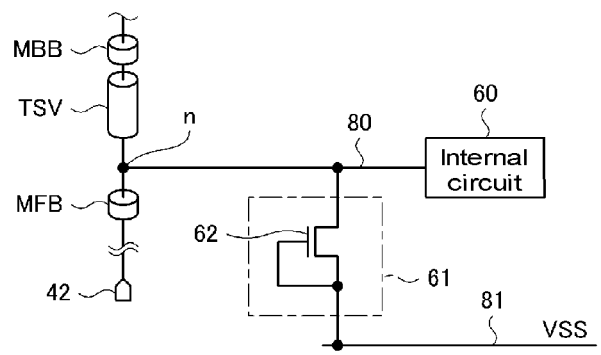
FIG. 4 shows the configuration of an electrostatic discharge protection circuit 61 internally provided in memory chips 21-24 shown in FIG. 1(b)

The memory chips 21-24 each internally comprise an electrostatic discharge protection circuit 61 illustrated in FIG. 4. The electrostatic discharge protection circuit 61 has the role of releasing, to a power supply line, static electricity supplied inside the chip through the front-surface micro-bumps MFB and is provided for each front-surface micro-bump MFB. In this mode of embodiment, the electrostatic discharge protection circuit 61 is disposed within a bump electrode placement region so the size of the memory chips 21-24 can be reduced as a result. The configuration of the electrostatic discharge protection circuit 61 will be described in detail below focusing on the memory chip 21, but the same also applies to the memory chips 22-24.

As shown in FIG. 4, the electrostatic discharge protection circuit 61 is formed by an N-channel-type MOS transistor 62 (first transistor) which is diode-connected. One end of the transistor 62 is connected to wiring 80 connecting an internal circuit 60 and a node n which is a memory chip-side end of the front-surface micro-bumps MFB. Meanwhile, another end of the transistor 62 is connected to power supply wiring 81 (first power supply line) which is supplied with a ground potential VSS. The forward direction of the transistor 62 runs from the power supply wiring 81 toward the wiring 80. The potential level of the wiring 80 is normally equal to or slightly greater than the potential level of the power source wiring 81, so current does not flow through the transistor 62. Meanwhile, if a large current is supplied to the wiring 80 due to electrostatic discharge or the like, the potential level of the wiring 80 becomes far higher than the potential level of the power supply wiring 81 so a breakdown current flows to the transistor 62. As a result, the large current supplied to the wiring 80 can be released to the power supply wiring 81 and therefore it is possible to protect the internal circuit 60 from electrostatic discharge by virtue of the electrostatic discharge protection circuit 61.

It should be noted that the configuration above the node n in FIG. 4 (the through-electrode TSV and the back-surface micro-bump MBB) is not provided in the memory chip 24. The configuration of the memory chip 24 is otherwise the same as that of the memory chip 21.

Figure 5:
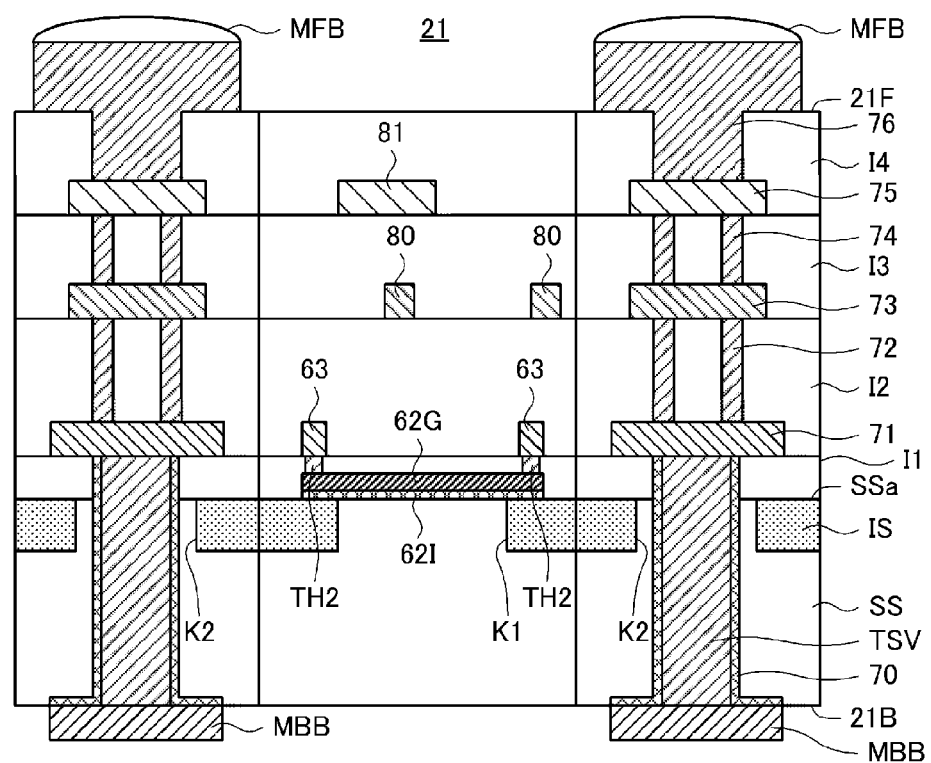
FIG. 5 is a schematic view in cross section of the memory chip 21 shown in FIG. 1(b), corresponding to the line C-C in FIG. 7.

The memory chip 21 according to this mode of embodiment comprises a semiconductor substrate SS, and insulating layers I1-I4 stacked in succession on a main surface SSa thereof, as shown in FIG. 5. The semiconductor substrate SS is a P-channel-type silicon substrate. An element-isolation insulating film IS is embedded in the main surface SSa, and as a result the main surface SSa is divided into an active region K1 in which the transistor 62 is formed and an active region K2 in which the through-electrode TSV is formed. The active regions K1 and K2 are both P-channel-type regions.

As shown in FIG. 5, the through-electrode TSV is provided running through the semiconductor substrate SS and the insulating layer I1. The back-surface micro-bump MBB is provided at an end of the through-electrode TSV on the back-surface side of the semiconductor substrate SS, i.e. on a back surface 21B side of the memory chip 21. An insulating film 70 is provided between the semiconductor substrate SS and the through-electrode TSV and back-surface micro-bump MBB, respectively, and this ensures isolation of the semiconductor substrate SS with the through-electrode TSV and back-surface micro-bump MBB, respectively.

An end of the through-electrode TSV on the main surface SSa side is connected to wiring 71 formed on the surface of the insulating layer I1. The wiring 71 is provided for each through-electrode TSV and is connected to wiring 73 formed on the surface of the insulating layer I2, with the interposition of through-hole conductors 72 running through the insulating layer I2. The wiring 73 is also provided for each through-electrode TSV and is connected to wiring 75 formed on the surface of the insulating layer I3, with the interposition of a plurality of through-hole conductors 74 running through the insulating layer I3. The wiring 75 is also provided for each through-electrode TSV and is connected to the front-surface micro-bump MFB formed on the surface of the insulating layer I4, i.e. to the main surface 21F of the memory chip 21, with the interposition of a plurality of through-hole conductors 76 running through the insulating layer I4. The back-surface micro-bump MBB and the front-surface micro-bump MFB are thus electrically connected by way of the through-electrode TSV.

It should be noted that the example shown in FIG. 5 relates to a case in which the through-electrode TSV is the through-electrode TSV1 shown in FIG. 3(a), but the basic structure is still the same for other types of through-electrodes TSV. For the through-electrode TSV2 shown in FIG. 3(b), the wiring 71 and/or 73 extends so as to produce the connections shown in FIG. 3(b).

Furthermore, FIG. 5 shows an example of the memory chip 21, but the configuration from the through-hole conductors 72 to the back-surface micro-bump MBB is absent from the memory chip 24 which is lacking the through-electrode TSV. In this case, there is no need to provide the active region K2 either and therefore various types of transistors including the transistor 62 can be disposed in a region lying over the front-surface micro-bump MFB as viewed in a plane.

The active region K1 in which the transistor 62 is formed is disposed between the active regions K2 in which the through-electrode TSV is formed, as shown in FIG. 5. The structure of the transistor 62 will be described in detail below with reference to FIG. 6(a)-(c), in addition to FIG. 5.

Figure 6:
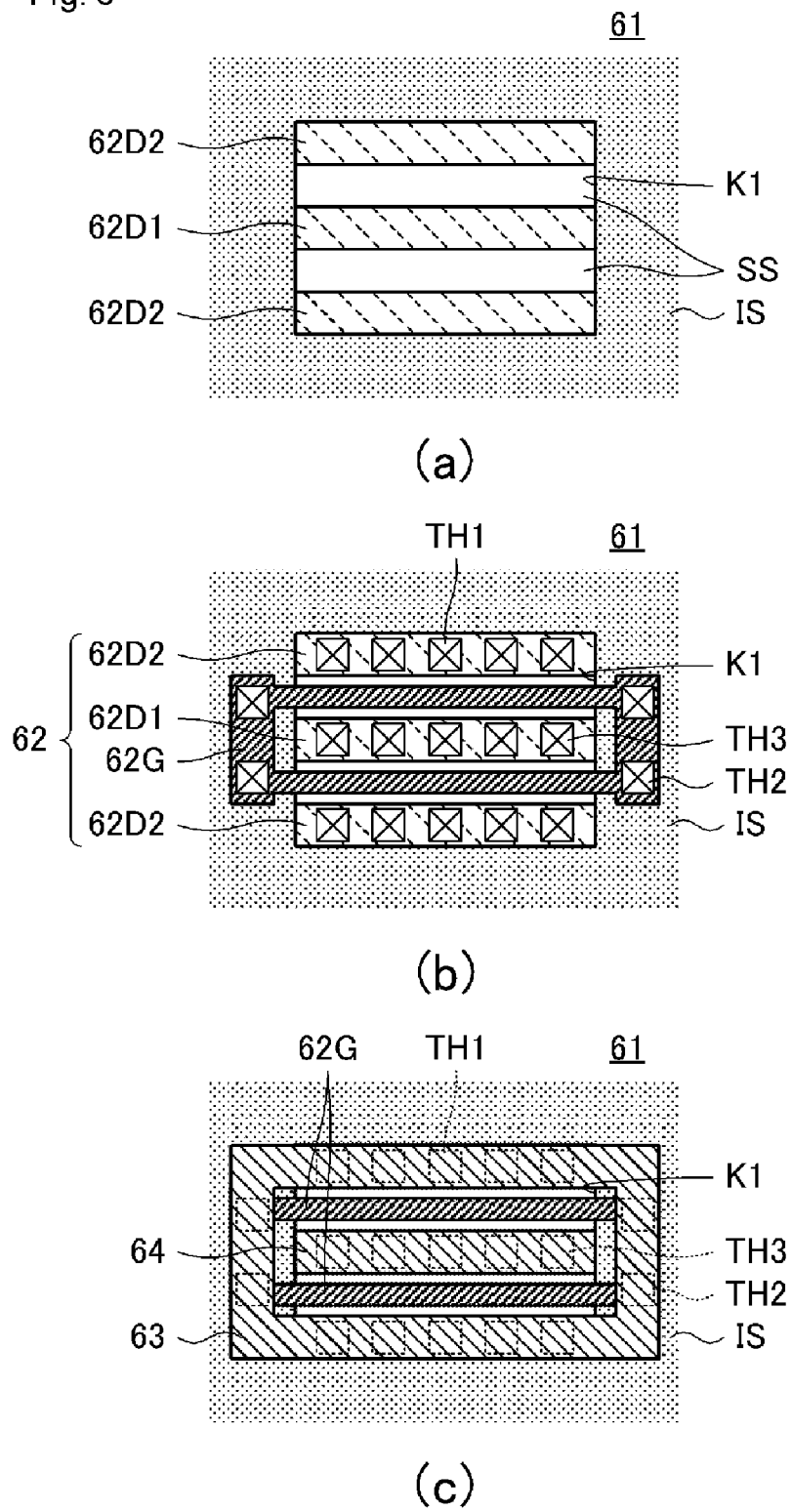
FIG. 6 (a) relates to the electrostatic discharge protection circuit 61 shown in FIG. 4 and is a plan view showing a configuration embedded in a main surface SSa of a semiconductor substrate SS shown in FIG. 5, (b) is a plan view in which a configuration formed on the main surface SSa has been added to (a), and (c) is a plan view in which a configuration formed on an upper surface of an insulating layer I1 shown in FIG. 5 has been added to (b)

As shown in FIG. 6(a), diffusion layers 62D1, 62D2 (first and second diffusion layers) constituting the source/drain, respectively, of the transistor 62 are formed within the active region K1. The diffusion layers 62D1, 62D2 are N-channel-type impurity diffusion layers formed by ion-implantation of N-channel-type impurity in the semiconductor substrate SS. One diffusion layer 62D2 is provided on both sides of the diffusion layer 62D1. The surface of the semiconductor substrate SS is exposed (in two locations) between the diffusion layer 62D1 and the diffusion layer 62D2, and a gate electrode 62G (first gate electrode) of the transistor 62 is formed on the upper surface of the exposed area with a gate insulating film 62I (see FIG. 5) interposed, as shown in FIG. 6(b). The gate electrode 62G extends outside of the active region K1.

As shown in FIG. 6(c), wiring 63, 64 is further formed above the transistor 62. The wiring 63 and the wiring 64 are both wiring formed on the upper surface of the insulating layer I1 shown in FIG. 5. The wiring 63 extends in such a way as to lie over the diffusion layer 62D2 and a portion of the gate electrode 62G formed in the active region K1, when seen in a plane, as will be understood from FIGS. 6(b) and (c). The wiring 63 is then electrically connected to the diffusion layer 62D2 by means of a through-hole conductor TH1 running through the insulating layer I1, while also being electrically connected to the gate electrode 62G by means of a through-hole conductor TH2 running through the insulating layer I1. The diffusion layer 62D2 and the gate electrode 62G are therefore short-circuited by way of the wiring 63 and as a result the diode-connection shown in FIG. 4 is achieved. Meanwhile, the wiring 64 extends to a position lying over the diffusion layer 62D1, when seen in a plane, and is connected to the diffusion layer 62D1 by means of a through-hole conductor TH3 running through the insulating layer I1.

The planar positional relationship of the front-surface micro-bumps MFB and the transistor 62 will be described next. The following description will focus on the region B shown in FIG. 2 but the same also applies to other regions.

Figure 7:
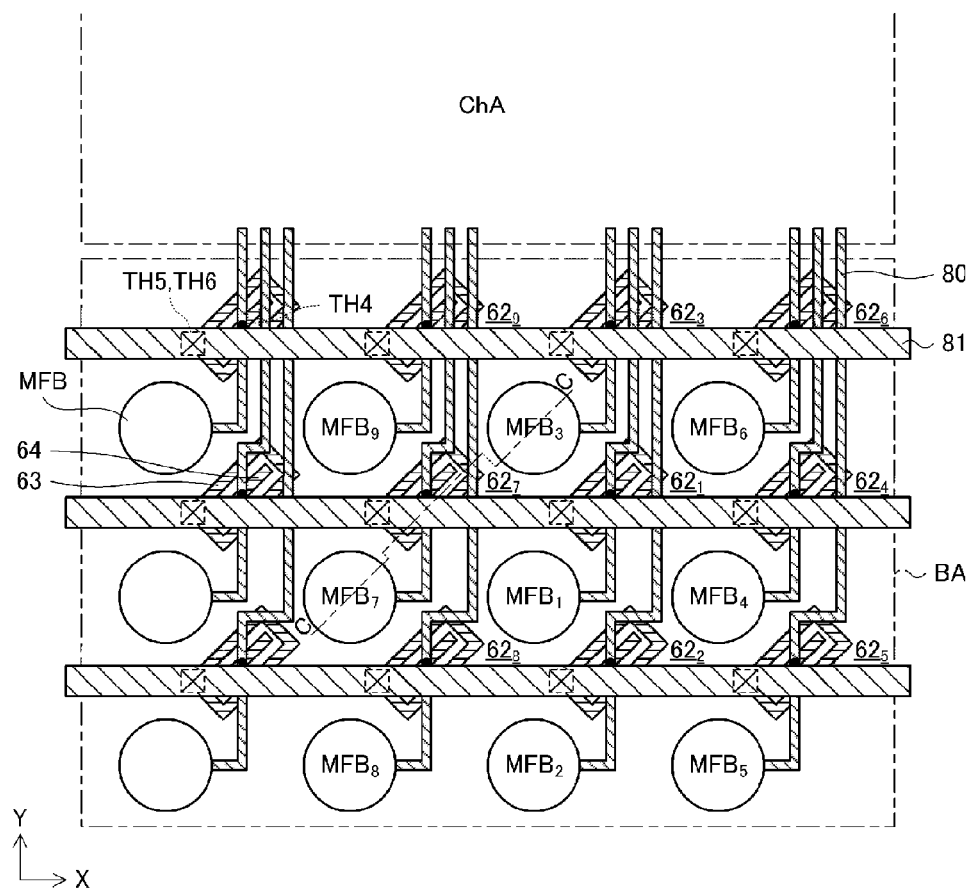
FIG. 7 is a plan view showing an enlargement of a region B shown in FIG. 2.

FIG. 7-FIG. 10 are transparent diagrams seen from the main surface 21F side, showing the configuration provided within the region B. As shown in FIG. 7, the plurality of front-surface micro-bumps MFB formed on the main surface 21F are disposed in the form of a matrix in a bump electrode placement region BA disposed adjacent to the channel ChA. The Y-direction pitch (first pitch) and X-direction pitch (first pitch) between the front-surface micro-bumps MFB are P1, P2, as will be understood from FIG. 8. The description will now focus on nine front-surface micro-bumps $MFB_1$-$MFB_9$ (first to ninth bump electrodes) shown in the same drawing.

As shown in FIG. 7, the front-surface micro-bumps $MFB_1$-$MFB_9$ are arranged in a 3×3 matrix. The front-surface micro-bump $MFB_1$ is disposed in the center of the 3×3 matrix. The front-surface micro-bumps $MFB_2$ and $MFB_3$ are disposed on both sides in the Y-direction (first direction) of the front-surface micro-bump $MFB_1$. The front-surface micro-bumps $MFB_1$-$MFB_3$ are therefore disposed in a row along the Y-direction. The front-surface micro-bumps $MFB_4$ and $MFB_7$ are disposed on both sides in the X-direction (second direction intersecting the first direction) of the front-surface micro-bump $MFB_1$. The front-surface micro-bumps $MFB_1$, $MFB_4$ and $MFB_7$ are therefore disposed in a row along the X-direction.

The front-surface micro-bumps $MFB_5$ and $MFB_8$ are disposed on both sides in the X-direction of the front-surface micro-bump $MFB_2$. Furthermore, the front-surface micro-bumps $MFB_6$ and $MFB_9$ are disposed on both sides in the X-direction of the front-surface micro-bump $MFB_3$. The front-surface micro-bumps $MFB_5$ and $MFB_6$ are disposed in a row along the Y-direction together with the front-surface micro-bump $MFB_4$. Furthermore, the front-surface micro-bumps $MFB_8$ and $MFB_9$ are disposed in a row along the Y-direction together with the front-surface micro-bump $MFB_7$.

As also mentioned above, a transistor 62 is provided for each front-surface micro-bump MFB. FIG. 7 does not show the transistor 62 itself, but as will be understood from FIG. 6(c), the transistor 62 is present in a region directly below the wiring 63 and the wiring 64. FIG. 7 depicts only reference symbols, with the transistors 62 corresponding to the front-surface micro-bumps $MFB_1$-$MFB_9$ being denoted transistors $62_1$-$62_9$ (first to ninth transistors).

Figure 8:
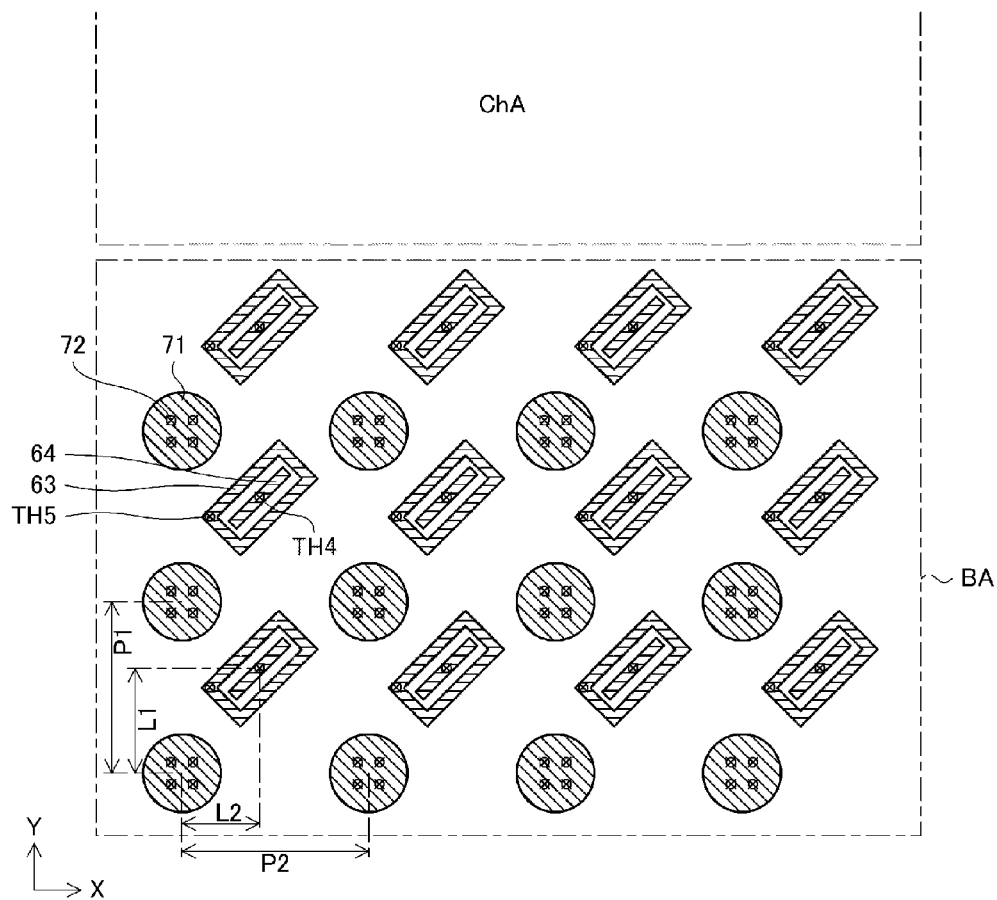
FIG. 8 is a plan view in which the configuration formed on the upper surface of the insulating layer I1 shown in FIG. 5 has been removed from the plan view of FIG. 7.

As will be understood from FIG. 8, the transistors 62 are disposed in such a way that the planar centers thereof are located at positions separated by L1 (first distance) in the Y-direction and separated by L2 (second distance) in the X-direction, when seen from the planar centers of the corresponding front-surface micro-bumps MFB. However, L1 is smaller than P1, and L2 is smaller than P2. As a result, the region in which the transistor $62_1$ is disposed is a region between the front-surface micro-bumps $MFB_4$-$MFB_6$ and the front-surface micro-bumps $MFB_7$-$MFB_9$, as shown in FIG. 8.

Figure 9:
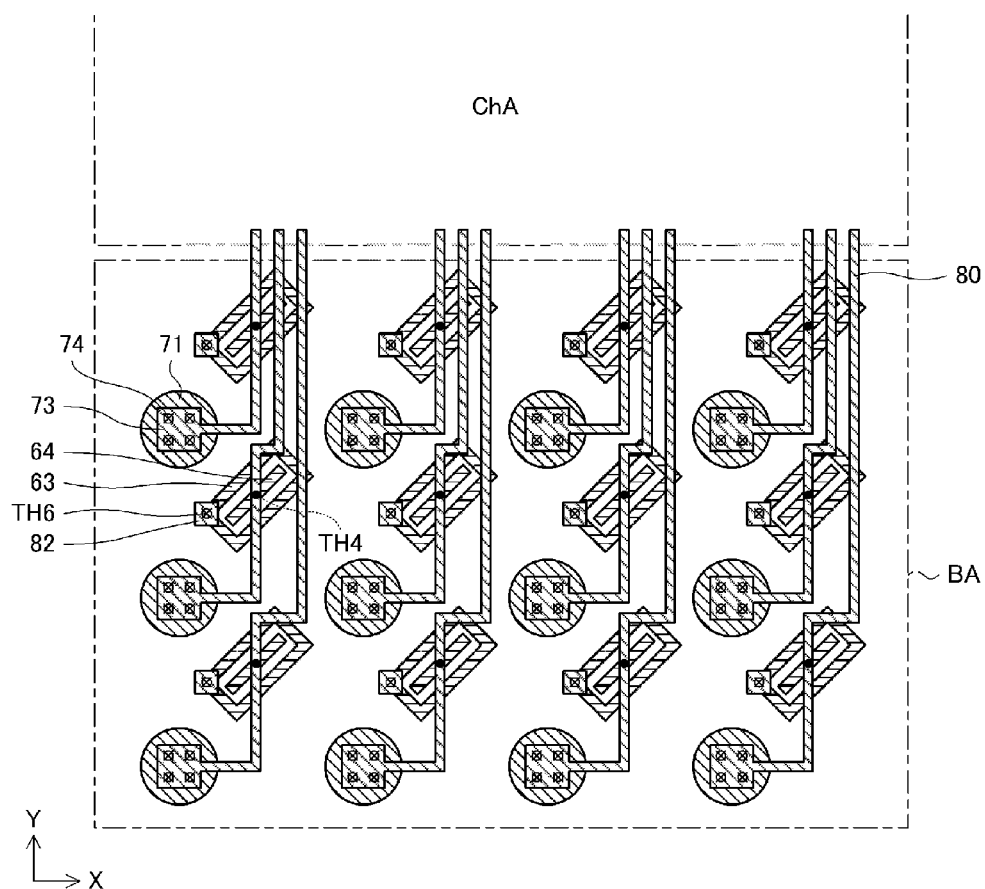
FIG. 9 is a plan view in which a configuration formed on an upper surface of an insulating layer I2 shown in FIG. 5 has been added to the plan view of FIG. 8.

The wiring 64 is connected to the wiring 80 also shown in FIG. 4 by way of a through-hole conductor TH4, as will be understood from FIG. 8 and FIG. 9. The through-hole conductor TH4 is a cylindrical conductor running through the insulating layer I2 shown in FIG. 5. The wiring 80 is provided for each front-surface micro-bump MFB and is formed on the upper surface of the insulating layer I2 shown in FIG. 5. As shown in FIG. 4, one end of the wiring 80 is connected to the internal circuit 60 inside the channel ChA, while the other end is connected to the wiring 73 connected to the corresponding front-surface micro-bump MFB. As shown in FIG. 5, the wiring 73 is connected to the corresponding front-surface micro-bump MFB by way of the through-hole conductor 74 running through the insulating layer I3. The wiring 64 and the corresponding front-surface micro-bump MFB are therefore connected to each other by way of the wiring 80, the wiring 73 and the through-hole conductor 74. Furthermore, the wiring 64 is connected to the diffusion layer 62D1 of the transistor 62 by way of the through-hole conductor TH3, as was described with reference to FIGS. 6(b) and (c). The diffusion layer 62D1 is therefore electrically connected to the corresponding front-surface micro-bump MFB.

Figure 10:
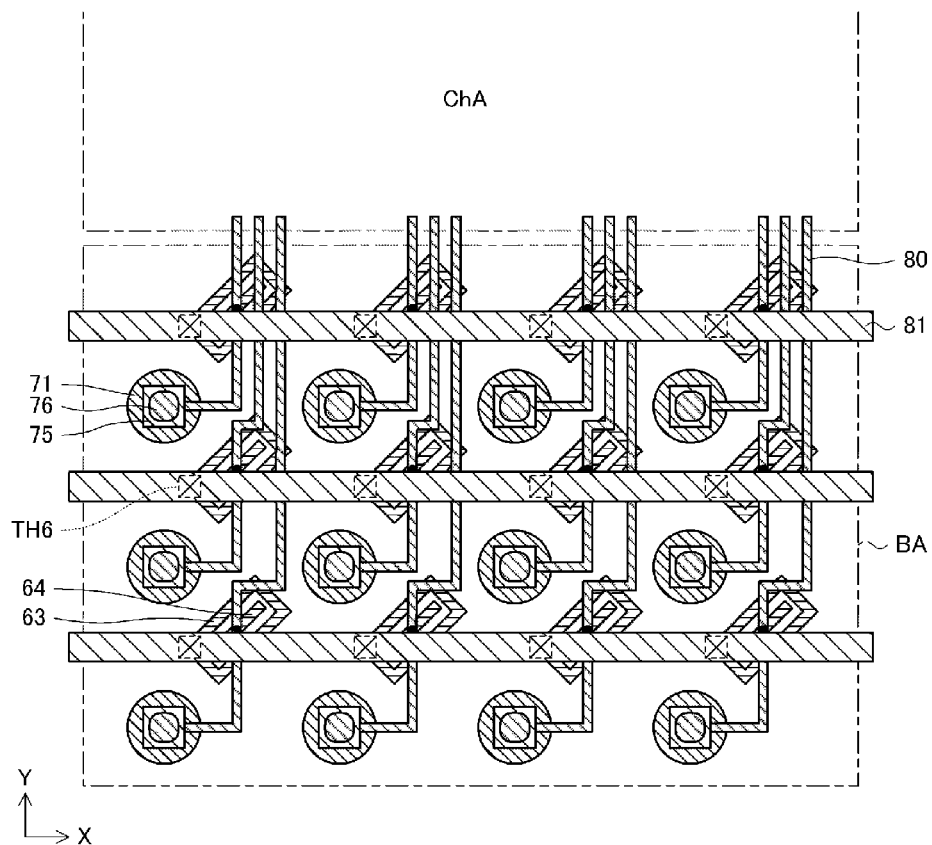
FIG. 10 is a plan view in which a configuration formed on an upper surface of an insulating layer I3 shown in FIG. 5 has been added to the plan view of FIG. 9.

The wiring 63 is connected to the power supply wiring 81 by way of a through-hole conductor TH5, power supply wiring 82 and a through-hole conductor TH6, as will be understood from FIG. 8 to FIG. 10. The through-hole conductors TH5-TH6 are cylindrical conductors running through the insulating layers 12, 13 shown in FIG. 5, and the power supply wiring 82 is formed on the upper surface of the insulating layer I2. The power supply wiring 81 is supplied with a ground potential VSS, as shown in FIG. 4, and is formed on the upper surface of the insulating layer I3 shown in FIG. 5. Furthermore, the wiring 63 is connected to the diffusion layer 62D2 and the gate electrode 62G of the transistor 62 by way of the through-hole conductors TH1, TH2, as was described with reference to FIGS. 6(b) and (c). The diffusion layer 62D2 and the gate electrode 62G are therefore electrically connected to the power supply wiring 81.

The connection relationship of the above will be described in relation to transistors $62_k$ shown in FIG. 7 (k is an integer from 1 to 9). The diffusion layer 62D1 ($(2k-1)^{th}$ diffusion layer) of the transistors $62_k$ is connected to the corresponding front-surface micro-bump $MFB_k$. The front-surface micro-bump $MFB_k$ is connected to the external terminal 42 and also to the front-surface micro-bump MFB provided in the memory chip of a layer above, via the through-electrode TSV ($k^{th}$ through-electrode). Furthermore, the diffusion layer 62D2 ($(2k)^{th}$ diffusion layer) of the transistors $62_k$ and the gate electrode 62G ($k^{th}$ gate electrode) are connected in common to the power supply wiring 81.

As described above, the semiconductor device 10 according to this mode of embodiment makes it possible for the electrostatic discharge protection circuit 61 (transistor 62) of each front-surface micro-bump MFB shown in FIG. 4 to be disposed within the bump electrode placement region BA. This means that there is no need for a region for placing the electrostatic discharge protection circuit 61 to be provided outside the bump electrode placement region BA, so the surface area can be utilized more efficiently and a more compact semiconductor device can be achieved.

A semiconductor device 10 according to a second mode of embodiment of the present invention will be described next.

The semiconductor device 10 according to this mode of embodiment differs from the semiconductor device 10 according to the first mode of embodiment in that a read data output circuit is disposed within the bump electrode placement region BA instead of the electrostatic discharge protection circuit 61. The semiconductor device 10 according to this mode of embodiment is otherwise the same as the semiconductor device 10 according to the first mode of embodiment, so the following description will focus on the difference. The description will focus on the memory chip 21 in the same way as the first mode of embodiment, but the same also applies to the memory chips 22-24.

Figure 11:
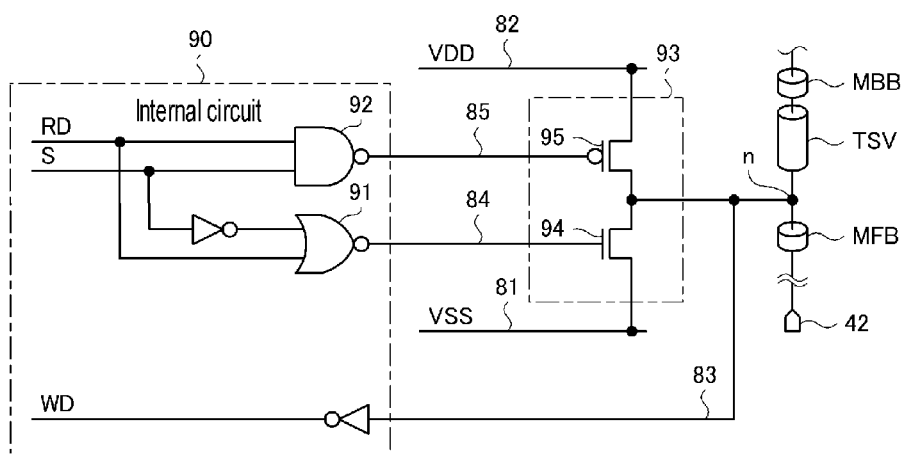
FIG. 11 shows the configuration of an output circuit 93 internally provided in the memory chips 21-24 included in a semiconductor device 10 according to a preferred second mode of embodiment of the present invention, and peripheral circuits thereto.

As shown in FIG. 11, a read data output circuit 93 comprises: an N-channel-type (first conduction type) MOS transistor 94 (first transistor) and a P-channel-type (second conduction type) MOS transistor 95 (second transistor). The transistors 94, 95 are connected in series between power supply wiring 81 (first power supply line) which is supplied with a ground potential VSS, and power supply wiring 82 (second power supply line) which is supplied with a power supply potential VDD. Contacts of the transistors 94, 95 constitute output ends of the output circuit 93, said contacts being connected to a node n constituting a memory chip-side end of the front-surface micro-bump MFB. The node n is also connected to an input end of an internal circuit 90 via wiring 83. Furthermore, the node n is also connected to a through-electrode TSV, as shown in FIG. 11, but only in the memory chips 21-23.

A gate electrode (first gate electrode) of the transistor 94 constitutes one input end of the output circuit 93 and is connected to an output end of a NOR circuit 91 included in the internal circuit 90. Furthermore, a gate electrode (second gate electrode) of the transistor 95 constitutes another input end of the output circuit 93 and is connected to an output end of a NAND circuit 92 included in the internal circuit 90. A potential expressing read data RD (output data) to be output from the NOR circuit 91 and the NAND circuit 92 via the corresponding front-surface micro-bump MFB (first bump electrode) is supplied to the respective gate electrodes of the transistors 94, 95.

To describe this in specific terms, the read data RD is supplied to one input end of the NOR circuit 91 and the NAND circuit 92, respectively, from a reading-related circuit which is not depicted. The reading-related circuit also generates a control signal S and an inverse signal of the control signal S is input to another input end of the NOR circuit 91 while the control signal S is input to another input end of the NAND circuit 92. The control signal S is a low active signal which is activated to a low level when the read data RD is not output. When the control signal S is at a low level, the outputs of the NOR circuit 91 and the NAND circuit 92 are fixed at a low level and a high level, respectively, and therefore the transistors 94, 95 are both OFF. The output circuit 93 is therefore in a high impedance state. On the other hand, when the control signal S is at a high level, a potential commensurate with the potential level of the read data RD is expressed at the output end of the output circuit 93. Specifically, when the read data RD is at a high level, the potential level at the output end of the output circuit 93 assumes the power supply potential VDD as a result of the transistor 95 being ON, and when the read data RD is at a low level, the potential level at the output end of the output circuit 93 assumes the ground potential VSS as a result of the transistor 94 being ON. The output of the output circuit 93 obtained in this way is output from the external terminal 42 via the front-surface micro-bump MFB as output data of the memory chip 21.

It should be noted that the external terminal 42 and the front-surface micro-bump MFB to which the output circuit 93 is connected are used for inputting write data WD. The write data WD is supplied from an external controller to the external terminal 42, and then supplied to the internal circuit 90 via the front-surface micro-bump MFB and the wiring 83.

Figure 12:
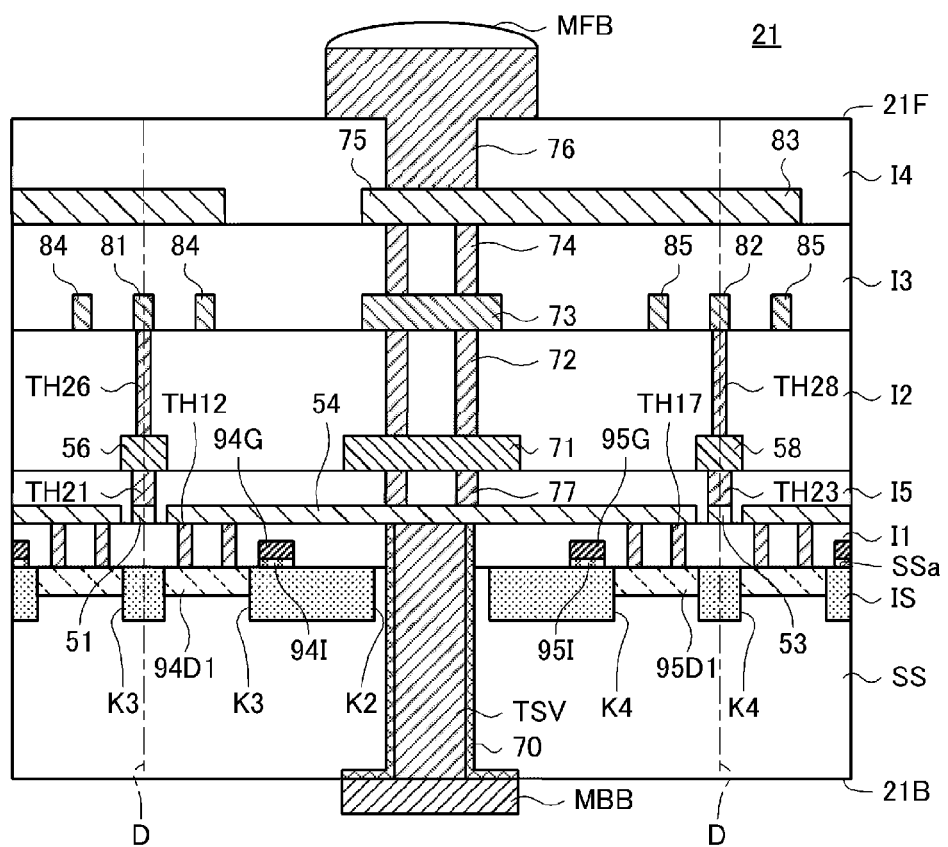
FIG. 12 is a schematic view in cross section of the memory chip 21 included in the semiconductor device 10 according to the second preferred mode of embodiment of the present invention, corresponding to the line E-E in FIG. 18.

As shown in FIG. 12, the memory chip 21 according to this mode of embodiment comprises a semiconductor substrate SS and insulating layers I1-I5 stacked in succession on a main surface SSa thereof. The insulating layer I5 is provided between the insulating layer I1 and the semiconductor substrate SS. The specific layer structure is the same as that of the memory chip 21 according to the first mode of embodiment, but differs from the memory chip 21 according to the first mode of embodiment in that the insulating layers have a five-layer structure (the memory chip 21 according to the first mode of embodiment has a four-layer structure). However, the memory chip 21 according to the first mode of embodiment may equally be endowed with a five-layer structure by providing the insulating layer I5.

The main surface SSa of the semiconductor substrate SS is divided, by means of an element-isolation insulating film IS embedded in the main surface SSa, into: an active region K3 (first active region) in which the transistor 94 is formed, an active region K4 (second active region) in which the transistor 95 is formed, and an active region K2 in which the through-electrode TSV is formed. The active regions K2, K3 are P-channel-type regions, and the active region K4 is an N-channel-type region (N-well) which is formed by ion-implantation of N-channel-type impurity in the semiconductor substrate SS which is a P-channel-type silicon substrate.

The configuration relating to the through-electrode TSV differs from that described with reference to FIG. 5 in terms of the portion relating to the insulating layer I5. This difference will be described below. An end of the through-electrode TSV on the main surface SSa side is connected to wiring 54 formed on the surface of the insulating layer I1. The wiring 54 is connected to wiring 71 formed on the surface of the insulating layer I5 by way of a plurality of through-hole conductors 77 running through the insulating layer I5. The wiring 71 is connected to the front-surface micro-bump MFB by way of the through-hole conductors 72, 74, as described with reference to FIG. 5.

Figure 13:
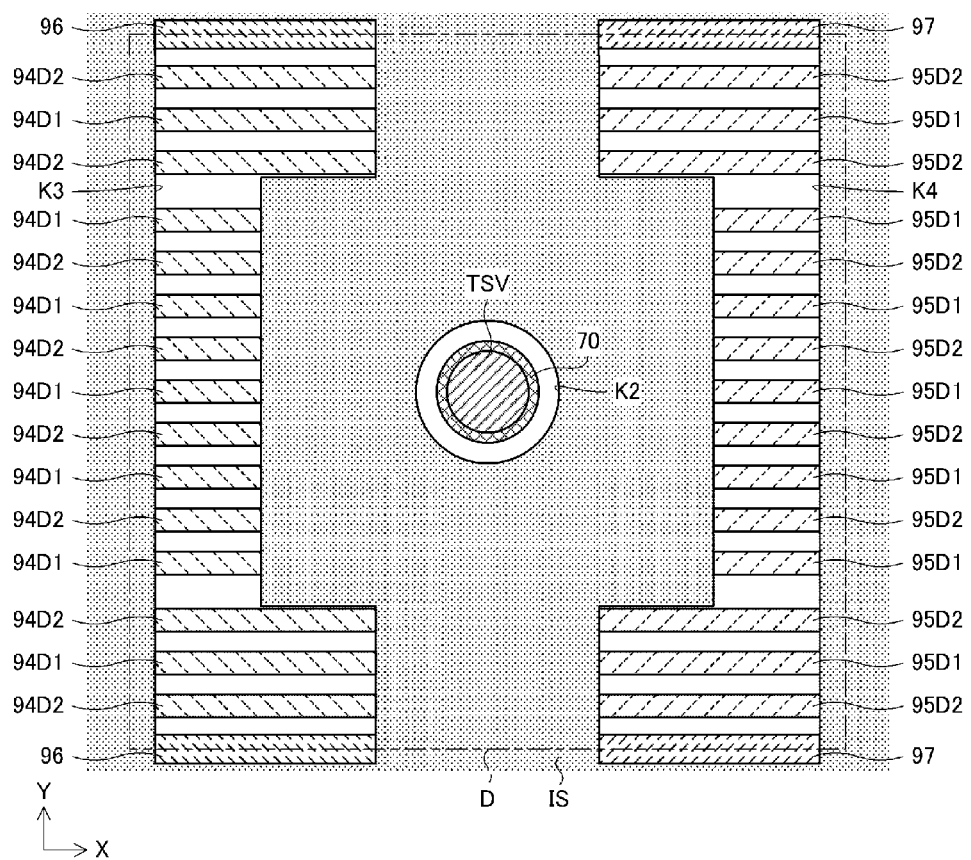
FIG. 13 is a plan view showing a configuration embedded in the main surface SSa of a semiconductor substrate SS shown in FIG. 12, in the vicinity of a front-surface micro-bump MFB in the semiconductor device 10 according to the preferred second mode of embodiment of the present invention.

As shown in FIG. 13, the active regions K3, K4 are provided on either side of the active region K2 in the X-direction. It should be noted that the region defined by the single-dot chain line D shown in FIG. 13-FIG. 18 illustrates a region corresponding to one front-surface micro-bump MFB. The active regions K3, K4 each have a shape which is long in the Y-direction with both ends in the Y-direction expanding toward the active region K2. This type of shape is used in order to maintain distance between the active regions K3, K4 and the active region K2, while also ensuring that the surface area of the active regions K3, K4 is as large as possible.

A plurality of respective diffusion layers 94D1, 94D2, 96 are formed inside the active region K3. The diffusion layers 94D1, 94D2, 96 are all N-channel-type impurity diffusion layers formed by ion-implantation of N-channel-type impurity in the semiconductor substrate SS. The diffusion layers 94D1, 94D2 constitute the source/drain, respectively, of the transistor 94. Meanwhile, the diffusion layer 96 is provided in order to supply the ground potential VSS to the active region K3.

As shown in FIG. 13, a plurality of respective diffusion layers 95D1, 95D2, 97 are likewise formed inside the active region K4. The diffusion layers 95D1, 95D2, 97 are all P-type impurity diffusion layers formed by ion-implantation of P-channel-type impurity in an N-well. The diffusion layers 95D1, 95D2 constitute the source/drain, respectively, of the transistor 95. Meanwhile, the diffusion layer 97 is provided in order to supply the power supply potential VDD to the active region K4.

As shown in FIG. 13, the diffusion layers 94D1, 94D2, 96, 95D1, 95D2, 97 have a rectangular shape which is elongate in the X-direction. One diffusion layer 96 is provided at each end of the active region K3. Meanwhile, a plurality of the diffusion layers 94D1, 94D2 (first and second diffusion layers) are alternately arranged in the Y-direction, with the diffusion layer 94D2 lying at both ends. One diffusion layer 97 is likewise provided at each end of the active region K4. Meanwhile, a plurality of the diffusion layers 95D1, 95D2 (third and fourth diffusion layers) are alternately arranged in the Y-direction, with the diffusion layer 95D2 lying at both ends.

Figure 14:
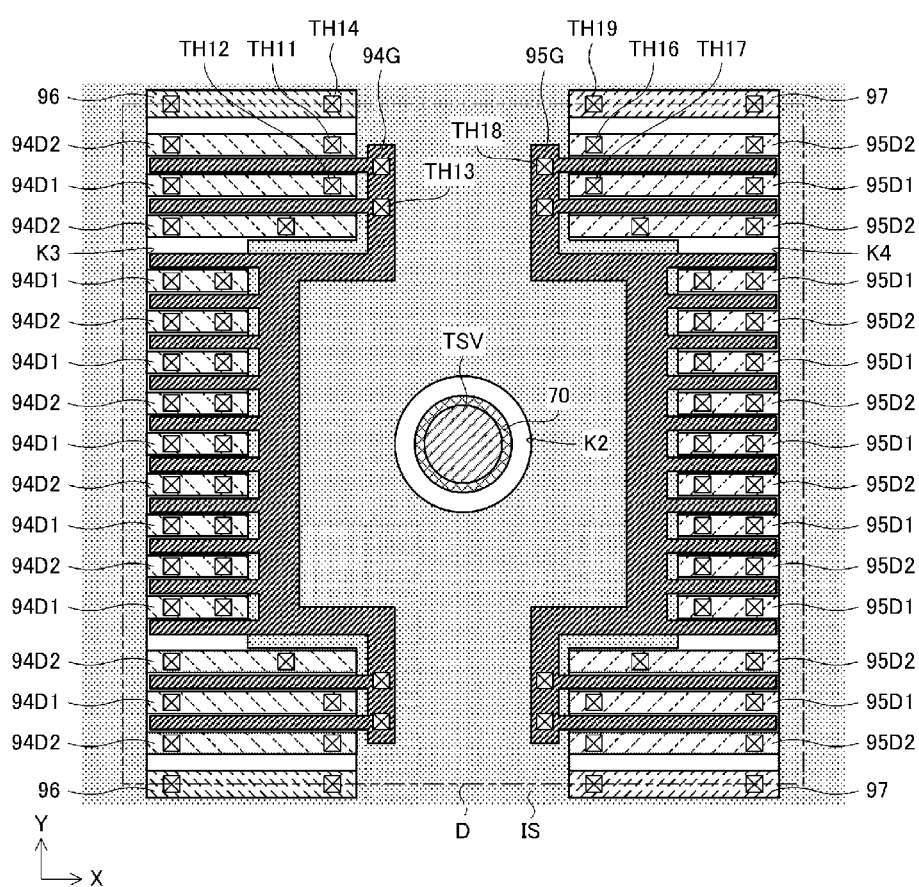
FIG. 14 is a plan view in which a configuration formed on the main surface SSa of the semiconductor substrate SS shown in FIG. 12 has been added to the plan view of FIG. 13.

As shown in FIG. 14, a comb-shaped gate electrode 94G is disposed above the active region K3 with the interposition of a gate insulating film 94I (see FIG. 12). This gate electrode 94G constitutes a gate electrode (first gate electrode) of the transistor 94. The surface of the semiconductor substrate SS is exposed between the diffusion layer 94D1 and the diffusion layer 94D2, and portions of the gate electrode 94G corresponding to the teeth of the comb are arranged in such a way as to cover the exposed areas. The portion of the gate electrode 94G corresponding to the shaft of the comb is disposed between the active region K3 and the active region K2. A comb-shaped gate electrode 95G is likewise disposed above the active region K4. This gate electrode 95G constitutes a gate electrode (second gate electrode) of the transistor 95. The surface of the semiconductor substrate SS is exposed between the diffusion layer 95D1 and the diffusion layer 95D2, and portions of the gate electrode 95G corresponding to the teeth of the comb are arranged in such a way as to cover the exposed areas. The portion of the gate electrode 95G corresponding to the shaft of the comb is disposed between the active region K4 and the active region K2.

Figure 15:
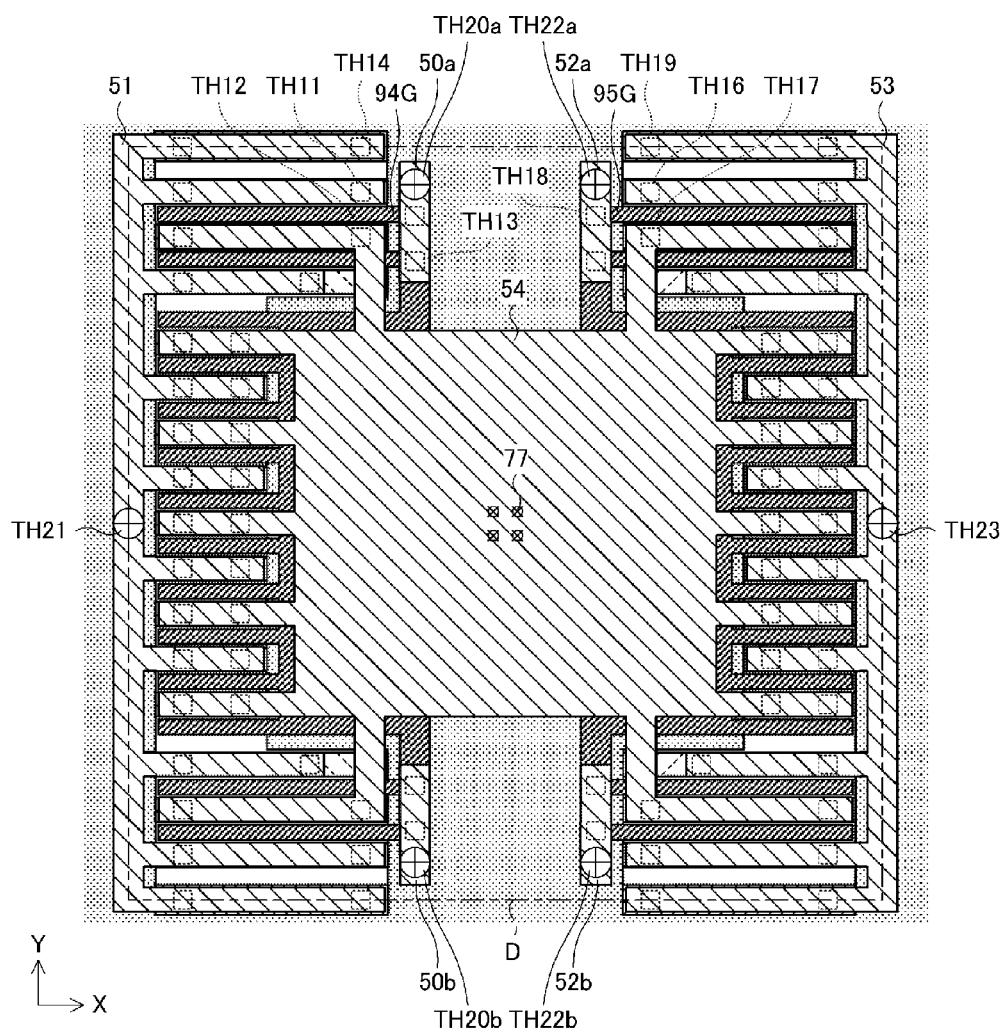
FIG. 15 is a plan view in which a configuration formed on an upper surface of an insulating layer I1 shown in FIG. 12 has been added to the plan view of FIG. 14.

The gate electrode 94G is connected to wiring 50a and wiring 50b formed on the upper surface of the insulating layer I1, as shown in FIG. 15, with the interposition of a through-hole conductor TH13 running through the insulating layer I1 shown in FIG. 12. The wiring 50a and the wiring 50b are provided at either end of the gate electrode 94G in the Y-direction. Furthermore, the wiring 50a and the wiring 50b are connected to wiring 55a and wiring 55b, respectively, formed on the upper surface of the insulating layer I5 with the interposition of through-hole conductors TH20a, TH20b running through the insulating layer I5 (FIG. 16), and the wiring 55a and the wiring 55b are each further connected to wiring 84 formed on the upper surface of the insulating layer I2 with the interposition of through-hole conductors TH25a, TH25b running through the insulating layer I2 (FIG. 17). As shown in FIG. 11, the wiring 84 is connected to an output of the NOR circuit 91 within the internal circuit 90. The output of the NOR circuit 91 is therefore supplied to the gate electrode 94G.

The gate electrode 95G is connected to wiring 52a and wiring 52b formed on the upper surface of the insulating layer I1, as shown in FIG. 15, with the interposition of a through-hole conductor TH18 running through the insulating layer I1 shown in FIG. 12. The wiring 52a and the wiring 52b are provided at either end of the gate electrode 95G in the Y-direction. The wiring 52a and the wiring 52b are connected to wiring 57a and wiring 57b, respectively, formed on the upper surface of the insulating layer I5 with the interposition of through-hole conductors TH22a, TH22b running through the insulating layer I5 (FIG. 16), and the wiring 57a and the wiring 57b are each further connected to wiring 85 formed on the upper surface of the insulating layer I2 with the interposition of through-hole conductors TH27a, TH27b running through the insulating layer I2 (FIG. 17). As shown in FIG. 11, the wiring 85 is connected to an output of the NAND circuit 92 within the internal circuit 90. The output of the NAND circuit 92 is therefore supplied to the gate electrode 95G.

As shown in FIG. 15, wiring 51 and the wiring 54 are disposed above the active region K3. The wiring 54 is also disposed above the active regions K2, K4. Wiring 53 is also disposed above the active region K4.

Figure 16:
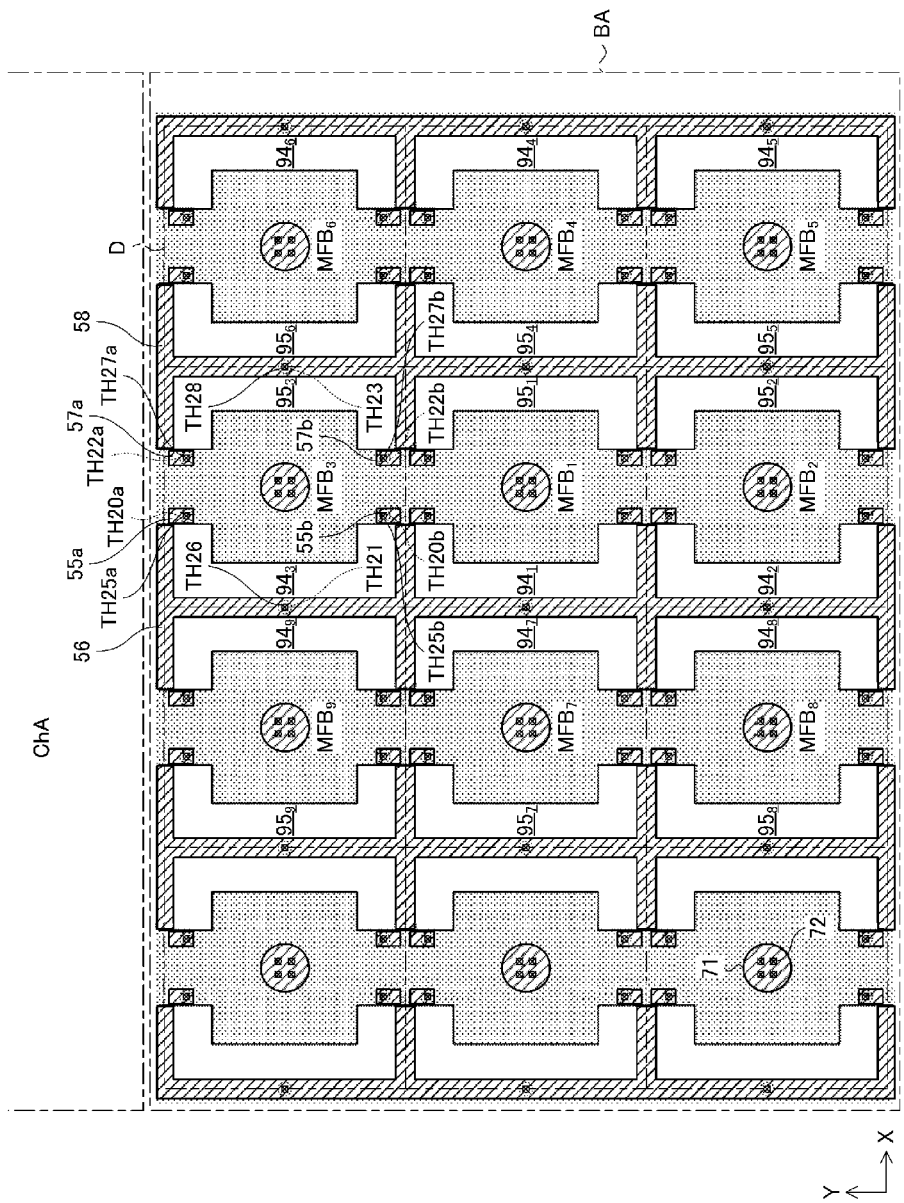
FIG. 16 is a plan view showing an enlargement of a region of the semiconductor device 10 according to the preferred second mode of embodiment of the present invention corresponding to the region B shown in FIG. 2.
Figure 17:
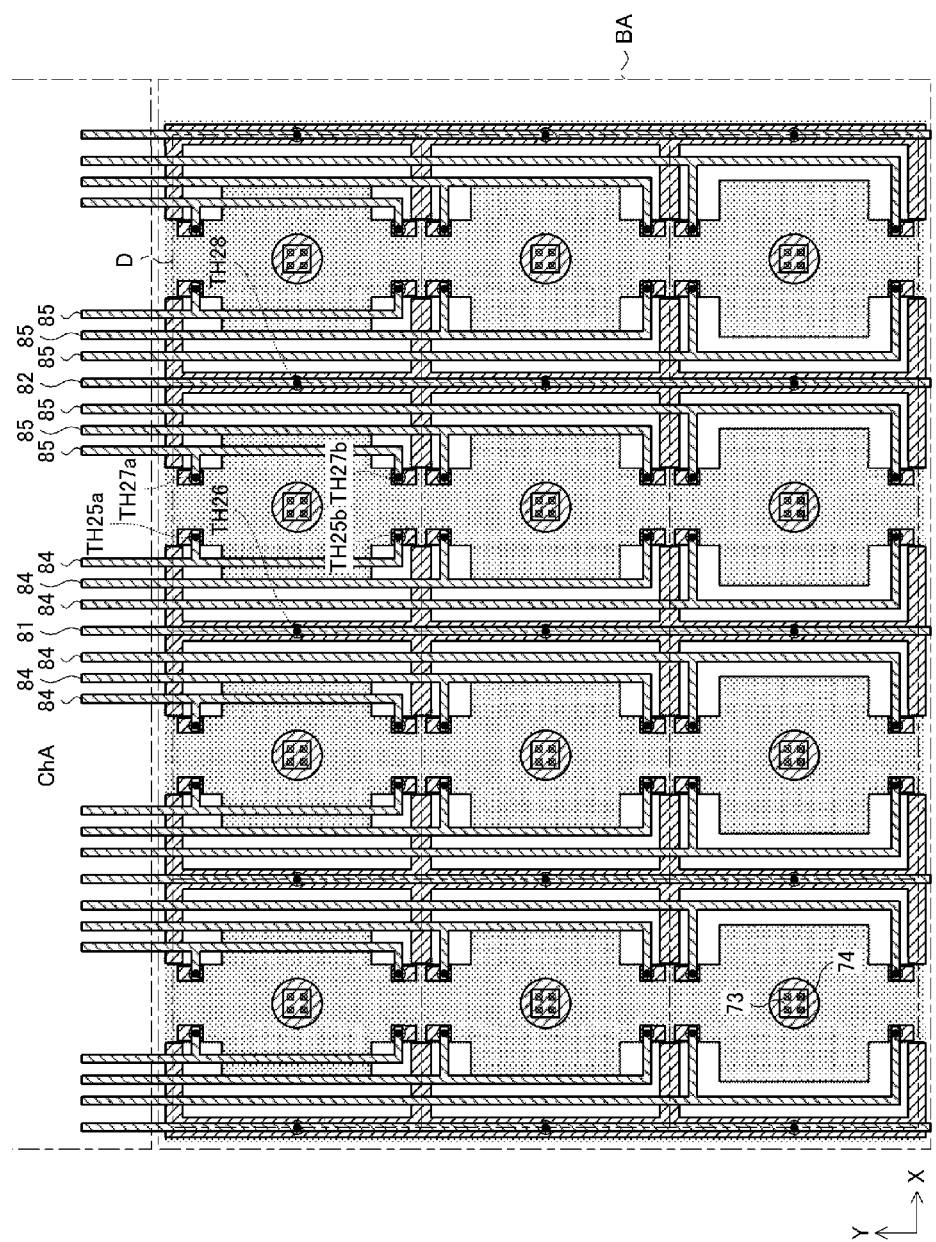
FIG. 17 is a plan view in which a configuration formed on an upper surface of an insulating layer I2 shown in FIG. 12 has been added to the plan view of FIG. 16.

The wiring 51 is connected to the diffusion layers 94D2, 96 with the interposition of through-hole conductors TH11, TH14 running through the insulating layer I1 shown in FIG. 12 (FIG. 15), and is also connected to wiring 56 formed on the upper surface of the insulating layer I5 with the interposition of a through-hole conductor TH21 running through the insulating layer I5 (FIG. 16). The wiring 56 is further connected to the power supply wiring 81 formed on the upper surface of the insulating layer I2, with the interposition of a through-hole conductor TH26 running through the insulating layer I2 (FIG. 17). The ground potential VSS is supplied to the power supply wiring 81, as shown in FIG. 11. The ground potential VSS is therefore supplied to the diffusion layers 94D2, 96.

The wiring 53 is connected to the diffusion layers 95D2, 97 with the interposition of through-hole conductors TH16, TH19 running through the insulating layer I1 shown in FIG. 12 (FIG. 15), and is also connected to wiring 58 formed on the upper surface of the insulating layer I5 with the interposition of a through-hole conductor TH23 running through the insulating layer I5 (FIG. 16). The wiring 58 is further connected to the power supply wiring 82 formed on the upper surface of the insulating layer I2, with the interposition of a through-hole conductor TH28 running through the insulating layer I2 (FIG. 17). The power supply potential VDD is supplied to the power supply wiring 82, as shown in FIG. 11. The power supply potential VDD is therefore supplied to the diffusion layers 95D2, 97.

As shown in FIG. 15, the wiring 54 is connected to the diffusion layer 94D1 with the interposition of a through-hole conductor TH12 running through the insulating layer I1 shown in FIG. 12, and is also connected to the diffusion layer 95D1 with the interposition of a through-hole conductor TH17 running through the insulating layer I1. Furthermore, the wiring 54 is connected to the through-electrode TSV and the front-surface micro-bump MFB, as described above (FIG. 12). The diffusion layers 94D1, 95D1 are therefore connected to the front-surface micro-bump MFB, as shown in FIG. 11.

Figure 18:
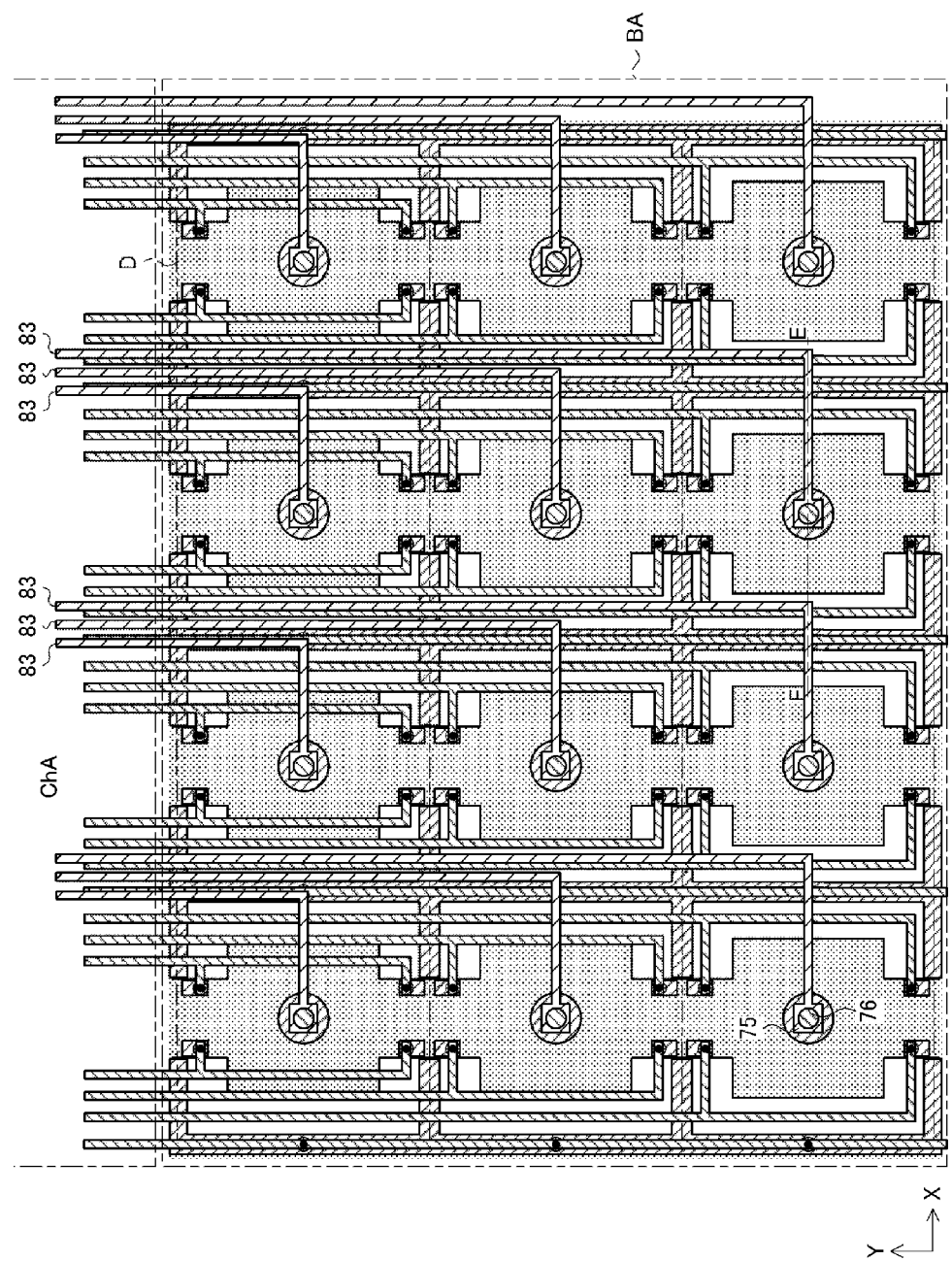
FIG. 18 is a plan view in which a configuration formed on an upper surface of an insulating layer I3 shown in FIG. 12 has been added to the plan view of FIG. 17.

In addition, the wiring 83 for the write data WD shown in FIG. 11 is formed on the upper surface of the insulating layer I3, as shown in FIG. 12 and FIG. 18, and is connected to the corresponding front-surface micro-bump MFB with the interposition of the wiring 75. The write data WD supplied to the front-surface micro-bump MFB can therefore be acquired by the internal circuit 90 via the wiring 83.

The planar arrangement of the transistors 94, 95 corresponding to the plurality of front-surface micro-bumps MFB will be described next. The following description will focus on the front-surface micro-bumps $MFB_1$-$MFB_9$ (first to ninth bump electrodes) shown in FIG. 16. It should be noted that the reference symbols indicated in FIG. 16 denote the front-surface micro-bumps MFB directly above the corresponding wiring 71. The front-surface micro-bumps $MFB_1$-$MFB_9$ are the same as the front-surface micro-bumps $MFB_1$-$MFB_9$ (FIG. 7) described in the first mode of embodiment.

The relative positional relationship of the front-surface micro-bumps $MFB_1$-$MFB_9$ is as described in the first mode of embodiment. In this mode of embodiment, the front-surface micro-bump $MFB_k$ (k is an integer from 1 to 9) corresponds to the transistor $94_k$ ($(2k-1)^{th}$ transistor) and the transistor $95_k$ ($(2k)^{th}$ transistor).

As shown in FIG. 16, the transistors $95_1$, $95_4$ are disposed in a region between the front-surface micro-bumps $MFB_1$ and $MFB_4$. Likewise, the transistors $95_2$, $95_5$ are disposed in a region between the front-surface micro-bumps $MFB_2$ and $MFB_5$, the transistors $95_3$, $95_6$ are disposed in a region between the front-surface micro-bumps $MFB_3$ and $MFB_6$, the transistors $94_1$, $94_7$ are disposed in a region between the front-surface micro-bumps $MFB_1$ and $MFB_7$, the transistors $94_2$, $94_8$ are disposed in a region between the front-surface micro-bumps $MFB_2$ and $MFB_8$, and the transistors $94_3$, $94_9$ are disposed in a region between the front-surface micro-bumps $MFB_3$ and $MFB_9$. In addition, the transistor $94_4$ is disposed on the opposite side of the front-surface micro-bump $MFB_4$ to the transistor $95_4$, the transistor $94_5$ is disposed on the opposite side of the front-surface micro-bump $MFB_5$ to the transistor $95_5$, the transistor $94_6$ is disposed on the opposite side of the front-surface micro-bump $MFB_6$ to the transistor $95_6$, the transistor $95_7$ is disposed on the opposite side of the front-surface micro-bump $MFB_7$ to the transistor $94_7$, the transistor $95_8$ is disposed on the opposite side of the front-surface micro-bump $MFB_8$ to the transistor $94_8$, and the transistor $95_9$ is disposed on the opposite side of the front-surface micro-bump $MFB_9$ to the transistor $94_9$.

As will be understood from the abovementioned arrangement, the transistors 94, 95 have an opposite arrangement on the left/right between front-surface micro-bumps MFB which are adjacent in the Y-direction. In this way it is possible for the wiring 56 (FIG. 16) and power supply wiring 81 (FIG. 17) for supplying the ground potential VSS, and the wiring 58 (FIG. 16) and the power supply wiring 82 (FIG. 16) for supplying the power supply potential VDD, to be shared between front-surface micro-bumps MFB which are adjacent in the X-direction. Moreover, as will be understood from FIG. 16 and FIG. 17, the wiring 56, wiring 58, wiring 81 and wiring 82 are connected in a shared manner between front-surface micro-bumps MFB which are adjacent in the Y-direction.

The abovementioned connection relationship will be described for the front-surface micro-bumps $MFB_1$-$MFB_9$. The diffusion layer 94D1 ($(4k-3)^{th}$ diffusion layer) of the transistor $94_k$ and the diffusion layer 95D1 ($(4k-1)^{th}$ diffusion layer) of the transistor $95_k$ are connected to the corresponding front-surface micro-bumps $MFB_k$. Furthermore, the diffusion layer 94D2 ($(4k-2)^{th}$ diffusion layer) of the transistor $94_k$ is connected, together with the diffusion layer 96, to the power supply wiring 81 (FIG. 17) to which the ground potential VSS is supplied, and the diffusion layer 95D2 ($(4k)^{th}$ diffusion layer) of the transistors $95_k$ is connected, together with the diffusion layer 97, to the power supply wiring 82 (FIG. 17) to which the power supply potential VDD is supplied.

As described above, by virtue of the configuration of the semiconductor device 10 according to this mode of embodiment, the output circuit 93 (transistors 94, 95) for each front-surface micro-bump MFB shown in FIG. 11 can be disposed within the bump electrode placement region BA. This means that there is no need for a region for placing the output circuit 93 to be provided outside the bump electrode placement region BA, so the surface area can be utilized more efficiently and a more compact semiconductor device can be achieved.

Preferred modes of embodiment of the present invention have been described above but the present invention is not limited to these modes of embodiment, and various modifications may be made within a scope that does not depart from the essential point of the present invention; it goes without saying that any such modifications are also included in the scope of the present invention.

Figure 19:
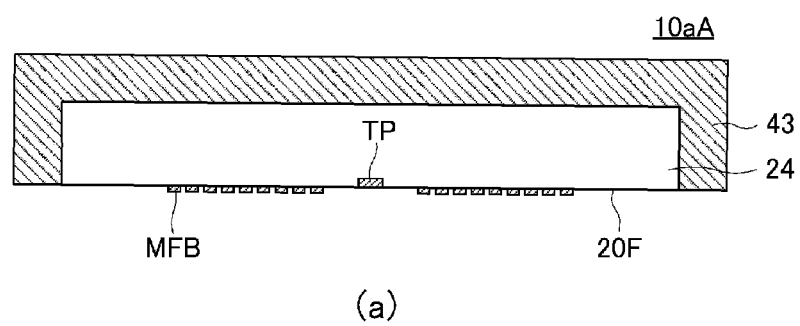
Figure 19:
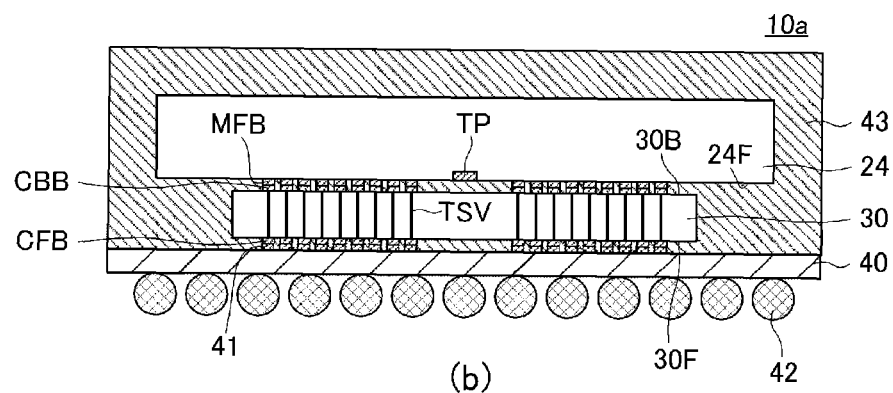

For example, the present invention may also be advantageously applied to a semiconductor device that does not employ memory chips having through-electrodes TSV. FIG. 19(b) shows an example of this kind of semiconductor device 10a. As shown in the drawing, the semiconductor device 10a has a configuration in which the memory chips 21-23 are removed from the semiconductor device 10 described in the first and second modes of embodiment and the memory chip 24 which is lacking through-electrodes TSV is stacked directly on the control chip 30. The present invention may also be advantageously applied to a read data output circuit and an electrostatic discharge section circuit internally provided in the memory chip 24 included in this kind of semiconductor device 10a. It should be noted that the semiconductor device 10a is also preferably manufactured by preparing a semifinished article 10aA shown in FIG. 19(a) and connecting this to the control chip 30 and circuit board 40 in the same way as with the semiconductor device 10.

KEY TO SYMBOLS 2, 3, 60, 90 . . . Internal circuit
10, 10a . . . Semiconductor device
10A, 10aA . . . Semifinished article
21-24 . . . Memory chip
30 . . . Control chip
40 . . . Circuit board
41 . . . Board electrode
42 . . . External terminal
43 . . . Sealing resin
50a, 50b, 52a, 52b, 51, 53, 54, 55a, 55b, 56, 57a, 57b, 58, 63, 64, 71, 73, 75, 80, 84, 85 . . . Wiring
81, 82 . . . Power supply wiring
61 . . . Electrostatic discharge protection circuit
62, $62_1$-$62_9$, 94, 95 . . . Transistor
62D1, 62D2, 94D1, 94D2, 96, 95D1, 95D2, 97 . . . Diffusion layer
62G, 94G . . . Gate electrode
62I, 94I . . . Gate insulating film
72, 74, 76, 77, TH1-TH6, TH11-TH14, TH16-TH19, TH20a, TH20b, TH21, TH22a, TH22b, TH23, TH25a, TH25b, TH26, TH27a, TH27b, TH28 . . . Through-hole conductor
91 . . . NOR circuit
92 . . . NAND circuit
93 . . . Output circuit
BA . . . Bump electrode placement region
CBB . . . Back-surface micro-bump
CFB . . . Front-surface micro-bump
ChA-ChD . . . Channel
I1-I5 . . . Insulating layer
IS . . . Element-isolation insulating film
K1-K4 . . . Active region
MBB . . . Back-surface micro-bump MFB, MFBa-MFBd, MFB₁-MFB₉ . . . Front-surface micro-bump
SS . . . Semiconductor substrate
TP . . . Test pattern
TSV, TSV1, TSV2 . . . Through-electrode

What is claimed is:

1. A semiconductor device comprising:
a semiconductor substrate;
first, second, and third bump electrodes which are formed on the semiconductor substrate and are disposed at a first pitch along a first direction;
fourth, fifth, and sixth bump electrodes which are formed on the semiconductor substrate and are disposed at the first pitch along the first direction;
seventh, eighth, and ninth bump electrodes which are formed on the semiconductor substrate and are disposed at the first pitch along the first direction;
a first transistor comprising first and second diffusion layers which are formed on the semiconductor substrate; and
a first power supply line disposed on the semiconductor substrate, wherein:
  the first, fourth and seventh bump electrodes are disposed along a second direction intersecting the first direction at a second pitch such that the first bump electrode is located between the fourth and seventh bump electrodes;
  the second, fifth and eighth bump electrodes are disposed along the second direction at the second pitch such that the second bump electrode is located between the fifth and eighth bump electrodes;
  the third, sixth and ninth bump electrodes are disposed at the second pitch along the second direction such that the third bump electrode is located between the sixth and ninth bump electrodes;
  the first diffusion layer is connected to the first bump electrode;
  the second diffusion layer is connected to the first power supply line; and
  the first transistor is disposed in a region between the fourth and sixth bump electrodes and the seventh and ninth bump electrodes.

2. The semiconductor device as claimed in claim 1, wherein the first to ninth bump electrodes are respectively connected to first to ninth through-electrodes running through the semiconductor substrate.

3. The semiconductor device as claimed in claim 1, wherein the first transistor further comprises a first gate electrode which is formed on the semiconductor substrate, and the first gate electrode is connected to the first power supply line.

4. The semiconductor device as claimed in claim 3, further comprising:
a second transistor comprising a second gate electrode and third and fourth diffusion layers formed on the semiconductor substrate;
a third transistor comprising a third gate electrode and fifth and sixth diffusion layers formed on the semiconductor substrate;
a fourth transistor comprising a fourth gate electrode and seventh and eighth diffusion layers formed on the semiconductor substrate;
a fifth transistor comprising a fifth gate electrode and ninth and tenth diffusion layers formed on the semiconductor substrate;
a sixth transistor comprising a sixth gate electrode and eleventh and twelfth diffusion layers formed on the semiconductor substrate;
a seventh transistor comprising a seventh gate electrode and thirteenth and fourteenth diffusion layers formed on the semiconductor substrate;
an eighth transistor comprising an eighth gate electrode and fifteenth and sixteenth diffusion layers formed on the semiconductor substrate; and
a ninth transistor comprising a ninth gate electrode and seventeenth and eighteenth diffusion layers formed on the semiconductor substrate, wherein:
  the third diffusion layer is connected to the second bump electrode;
  the fifth diffusion layer is connected to the third bump electrode;
  the seventh diffusion layer is connected to the fourth bump electrode;
  the ninth diffusion layer is connected to the fifth bump electrode;
  the eleventh diffusion layer is connected to the sixth bump electrode;
  the thirteenth diffusion layer is connected to the seventh bump electrode;
  the fifteenth diffusion layer is connected to the eighth bump electrode;
  the seventeenth diffusion layer is connected to the ninth bump electrode;
  the fourth diffusion layer, the second gate electrode, the sixth diffusion layer, the third gate electrode, the eighth diffusion layer, the fourth gate electrode, the tenth diffusion layer, the fifth gate electrode, the twelfth diffusion layer, the sixth gate electrode, the fourteenth diffusion layer, the seventh gate electrode, the sixteenth diffusion layer, the eighth gate electrode, the eighteenth diffusion layer, and the ninth gate electrode are connected to the first power supply line;
  the first to ninth transistors are disposed in such a way that the planar centers thereof are located at positions separated by a first distance in the first direction and separated by a second distance in the second direction, as seen from the planar centers of the corresponding first to ninth bump electrodes,
  the first distance is smaller than the first pitch; and
  the second distance is smaller than the second pitch.

5. The semiconductor device as claimed in claim 1, further comprising:
a second transistor comprising third and fourth diffusion layers formed on the semiconductor substrate; and
a second power supply line which is disposed on the semiconductor substrate and is supplied with a different potential to the first power supply line, wherein:
  the third diffusion layer is connected to the first bump electrode;
  the fourth diffusion layer is connected to the second power supply line;
  the first transistor is disposed in a region between the first bump electrode and the seventh bump electrode; and
  the second transistor is disposed in a region between the first bump electrode and the fourth bump electrode.

6. The semiconductor device as claimed in claim 5, further comprising:
a first active region disposed in a region between the first bump electrode and the seventh bump electrode; and a second active region disposed in a region between the first bump electrode and the fourth bump electrode, wherein
the first and second diffusion layers are disposed within the first active region; and
the third and fourth diffusion layers are disposed within the second active region.

7. The semiconductor device as claimed in claim 5, wherein the first transistor is a transistor of a first conduction type, and the second transistor is a transistor of a second conduction type different from the first conduction type.

8. The semiconductor device as claimed in claim 5, wherein:
the first transistor comprises a first gate electrode;
the second transistor comprises a second gate electrode; and
a potential expressing output data to be output through the first bump electrode is supplied to the first and second gate electrodes.

9. The semiconductor device as claimed in claim 5, further comprising:
a third transistor comprising fifth and sixth diffusion layers formed on the semiconductor substrate;
a fourth transistor comprising seventh and eighth diffusion layers formed on a semiconductor substrate;
a fifth transistor comprising ninth and tenth diffusion layers formed on the semiconductor substrate;
a sixth transistor comprising eleventh and twelfth diffusion layers formed on the semiconductor substrate;
a seventh transistor comprising thirteenth and fourteenth diffusion layers formed on the semiconductor substrate;
an eighth transistor comprising fifteenth and sixteenth diffusion layers formed on the semiconductor substrate;
a ninth transistor comprising seventeenth and eighteenth diffusion layers formed on the semiconductor substrate;
a tenth transistor comprising nineteenth and twentieth diffusion layers formed on the semiconductor substrate;
an eleventh transistor comprising twenty-first and twenty-second diffusion layers formed on the semiconductor substrate;
a twelfth transistor comprising twenty-third and twenty-fourth diffusion layers formed on the semiconductor substrate;
a thirteenth transistor comprising twenty-fifth and twenty-sixth diffusion layers formed on the semiconductor substrate;
a fourteenth transistor comprising twenty-seventh and twenty-eighth diffusion layers formed on the semiconductor substrate;
a fifteenth transistor comprising twenty-ninth and thirtieth diffusion layers formed on the semiconductor substrate;
a sixteenth transistor comprising thirty-first and thirty-second diffusion layers formed on the semiconductor substrate;
a seventeenth transistor comprising thirty-third and thirty-fourth diffusion layers formed on the semiconductor substrate; and
an eighteenth transistor comprising thirty-fifth and thirty-sixth diffusion layers formed on the semiconductor substrate; wherein:
the fifth and seventh diffusion layers are connected to the second bump electrode;
the ninth and eleventh diffusion layers are connected to the third bump electrode;
the thirteenth and fifteenth diffusion layers are connected to the fourth bump electrode;
the seventeenth and nineteenth diffusion layers are connected to the fifth bump electrode;
the twenty-first and twenty-third diffusion layers are connected to the sixth bump electrode;
the twenty-fifth and twenty-seventh diffusion layers are connected to the seventh bump electrode;
the twenty-ninth and thirty-first diffusion layers are connected to the eighth bump electrode;
the thirty-third and thirty-fifth diffusion layers are connected to the ninth bump electrode;
the sixth, tenth, fourteenth, eighteenth, twenty-second, twenty-sixth, thirtieth and thirty-fourth diffusion layers are connected to the first power supply line;
the eighth, twelfth, sixteenth, twentieth, twenty-fourth, twenty-eighth, thirty-second and thirty-sixth diffusion layers are connected to the second power supply line;
the second and eighth transistors are disposed in a region between the first bump electrode and the fourth bump electrode;
the first and thirteenth transistors are disposed in a region between the first bump electrode and the seventh bump electrode;
the fourth and tenth transistors are disposed in a region between the second bump electrode and the fifth bump electrode;
the third and fifteenth transistors are disposed in a region between the second bump electrode and the eighth bump electrode;
the sixth and twelfth transistors are disposed in a region between the third bump electrode and the sixth bump electrode;
the fifth and seventeenth transistors are disposed in a region between the third bump electrode and the ninth bump electrode;
the seventh transistor is disposed on the opposite side of the fourth bump electrode to the eighth transistor;
the ninth transistor is disposed on the opposite side of the fifth bump electrode to the tenth transistor;
the eleventh transistor is disposed on the opposite side of the sixth bump electrode to the twelfth transistor;
the fourteenth transistor is disposed on the opposite side of the seventh bump electrode to the thirteenth transistor;
the sixteenth transistor is disposed on the opposite side of the eighth bump electrode to the fifteenth transistor;
the eighteenth transistor is disposed on the opposite side of the ninth bump electrode to the seventeenth transistor;
the first, third, fifth, seventh, ninth, eleventh, thirteenth, fifteenth and seventeenth transistors are transistors of a first conduction type; and
the second, fourth, sixth, eighth, tenth, twelfth, fourteenth, sixteenth and eighteenth transistors are transistors of a second conduction type different from the first conduction type.

* * * * *